US010199798B2

(12) United States Patent
Faircloth et al.

(10) Patent No.: US 10,199,798 B2
(45) Date of Patent: Feb. 5, 2019

(54) DOWNHOLE LASER SYSTEMS, APPARATUS AND METHODS OF USE

(71) Applicant: FORO ENERGY, INC., Houston, TX (US)

(72) Inventors: Brian O Faircloth, Houston, TX (US); Yeshaya Koblick, Sharon, MA (US); Joel F. Moxley, Highlands Ranch, CO (US); Mark S. Zediker, Castle Rock, CO (US)

(73) Assignee: Foro Energy, Inc., Littleton, CO (US)

( * ) Notice: Subject to any disclaimer, the term of this patent is extended or adjusted under 35 U.S.C. 154(b) by 23 days.

(21) Appl. No.: 14/958,864

(22) Filed: Dec. 3, 2015

(65) Prior Publication Data
US 2016/0084008 A1 Mar. 24, 2016

Related U.S. Application Data

(60) Continuation-in-part of application No. 14/791,172, filed on Jul. 2, 2015, now Pat. No. 9,327,810, and a
(Continued)

(51) Int. Cl.
| | | |
|---|---|---|
| *G02B 6/42* | (2006.01) | |
| *H01S 5/024* | (2006.01) | |
| *G02B 6/36* | (2006.01) | |
| *E21B 7/14* | (2006.01) | |
| *B23K 26/382* | (2014.01) | |
| *B23K 26/146* | (2014.01) | |
| *E21B 29/02* | (2006.01) | |
| *H01S 3/067* | (2006.01) | |
| *H01S 3/094* | (2006.01) | |
| *G02B 6/32* | (2006.01) | |
| *H01S 3/16* | (2006.01) | |
| *H01S 3/00* | (2006.01) | |
| *G02B 23/24* | (2006.01) | |
| *B23K 103/00* | (2006.01) | |

(52) U.S. Cl.
CPC ........ *H01S 5/02423* (2013.01); *B23K 26/146* (2015.10); *B23K 26/382* (2015.10); *E21B 7/14* (2013.01); *E21B 29/02* (2013.01); *G02B 6/3624* (2013.01); *H01S 3/0675* (2013.01); *H01S 3/094042* (2013.01); *B23K 2103/50* (2018.08); *G02B 6/32* (2013.01); *G02B 6/4296* (2013.01); *G02B 23/2492* (2013.01); *H01S 3/005* (2013.01); *H01S 3/094003* (2013.01); *H01S 3/1608* (2013.01); *H01S 3/1616* (2013.01)

(58) Field of Classification Search
None
See application file for complete search history.

(56) References Cited

U.S. PATENT DOCUMENTS

| | | | | |
|---|---|---|---|---|
| 4,282,940 A * | 8/1981 | Salisbury | ................. | B26F 1/31 |
| | | | | 175/11 |
| 2010/0044106 A1* | 2/2010 | Zediker | .................... | E21B 7/14 |
| | | | | 175/16 |

* cited by examiner

*Primary Examiner* — Chad H Smith
(74) *Attorney, Agent, or Firm* — Glen P. Belvis; Belvis Law, LLC.

(57) ABSTRACT

Systems, apparatus and methods for performing laser operations in boreholes and other remote locations, such operations including laser drilling of a borehole in the earth, and laser workover and completion operations. Systems, apparatus and methods for generating and delivering high power laser energy below the surface of the earth and within a borehole. Laser operations using such down hole generated laser beams.

48 Claims, 9 Drawing Sheets

Related U.S. Application Data continuation-in-part of application No. 14/746,382, filed on Jun. 22, 2015, now Pat. No. 9,784,037, and a continuation-in-part of application No. 14/330,980, filed on Jul. 14, 2014, and a continuation-in-part of application No. 14/214,304, filed on Mar. 14, 2014, and a continuation-in-part of application No. 14/099,948, filed on Dec. 7, 2013, and a continuation-in-part of application No. 13/403,741, filed on Feb. 23, 2012, and a continuation-in-part of application No. 13/403,287, filed on Feb. 23, 2012, now Pat. No. 9,074,422, which is a continuation of application No. 13/403,509, filed on Feb. 23, 2012, now Pat. No. 9,360,631, and a continuation-in-part of application No. 13/347,445, filed on Jan. 10, 2012, now Pat. No. 9,080,425, which is a continuation of application No. 13/222,931, filed on Aug. 31, 2011, and a continuation-in-part of application No. 13/210,581, filed on Aug. 16, 2011, now Pat. No. 8,662,160, and a continuation-in-part of application No. 12/544,094, filed on Aug. 19, 2009, now Pat. No. 8,424,617, and a continuation-in-part of application No. 12/544,136, filed on Aug. 19, 2009, now Pat. No. 8,511,401, and a division of application No. 12/543,986, filed on Aug. 19, 2009, now Pat. No. 8,826,973, and a continuation-in-part of application No. 12/544,038, filed on Aug. 19, 2009, now Pat. No. 8,820,434, and a continuation-in-part of application No. 12/543,986, filed on Aug. 19, 2009, now Pat. No. 8,826,973.

(60) Provisional application No. 61/786,687, filed on Mar. 15, 2013, provisional application No. 61/786,763, filed on Mar. 15, 2013, provisional application No. 61/734,809, filed on Dec. 7, 2012, provisional application No. 61/446,042, filed on Feb. 24, 2011, provisional application No. 61/446,312, filed on Feb. 24, 2011, provisional application No. 61/446,043, filed on Feb. 24, 2011, provisional application No. 61/446,040, filed on Feb. 24, 2011, provisional application No. 61/446,312, filed on Feb. 24, 2011, provisional application No. 61/431,830, filed on Feb. 7, 2011, provisional application No. 61/431,827, filed on Jan. 11, 2011, provisional application No. 61/378,910, filed on Aug. 31, 2010, provisional application No. 61/153,271, filed on Feb. 17, 2009, provisional application No. 61/106,472, filed on Oct. 17, 2008, provisional application No. 61/110,273, filed on Oct. 3, 2008, provisional application No. 61/090,384, filed on Aug. 20, 2008.

DOWNHOLE LASER SYSTEMS, APPARATUS AND METHODS OF USE

This application is: (i) a continuation-in-part of U.S. patent application Ser. No. 13/403,509 filed Feb. 23, 2012, which is a continuation-in-part of U.S. patent application Ser. No. 12/544,136 filed Aug. 19, 2009 (issued as U.S. Pat. No. 8,511,401), Ser. No. 12/544,038 filed Aug. 19, 2009 (issued as U.S. Pat. No. 8,820,434), Ser. No. 12/544,094 filed Aug. 19, 2009 (issued as U.S. Pat. No. 8,424,617), and Ser. No. 12/543,986 filed Aug. 19, 2009 (issued as U.S. Pat. No. 8,826,973), and which claims under 35 U.S.C. § 119 (e)(1), the benefit of the filing date of Aug. 20, 2008 of U.S. provisional application Ser. No. 61/090,384, the benefit of the filing date of Oct. 3, 2008 of U.S. provisional application Ser. No. 61/102,730, the benefit of the filing date of Oct. 17, 2008 of U.S. provisional application Ser. No. 61/106,472 and the benefit of the filing date of Feb. 17, 2009 of provisional application Ser. No. 61/153,271; (ii) is a continuation-in-part of U.S. patent application Ser. No. 14/330,980 filed Jul. 14, 2014, which is a divisional of U.S. patent application Ser. No. 12/543,986 filed Aug. 19, 2009 (issued as U.S. Pat. No. 8,826,973), which claims under 35 U.S.C. § 119(e)(1), the benefit of the filing date of Aug. 20, 2008 of U.S. provisional application Ser. No. 61/090,384, the benefit of the filing date of Oct. 3, 2008 of U.S. provisional application Ser. No. 61/102,730, the benefit of the filing date of Oct. 17, 2008 of U.S. provisional application Ser. No. 61/106,472 the benefit of the filing date of Feb. 17, 2009 of provisional application Ser. No. 61/153,271; (iii) is a continuation-in-part of U.S. patent application Ser. No. 14/791,172, filed Jul. 2, 2015, which is a continuation of Ser. No. 13/347,445 filed Jan. 1, 2012 (issued as U.S. Pat. No. 9,080,425), which claims under 35 U.S.C. § 119(e)(1), the benefit of the filing date of Feb. 7, 2011 of provisional application Ser. No. 61/431,830, and the benefit of the filing date of Jan. 11, 2011 of provisional application Ser. No. 61/431,827; (iv) is a continuation-in-part of U.S. patent application Ser. No. 13/403,741 filed Feb. 23, 2012, which claims under 35 U.S.C. § 119(e)(1), the benefit of the filing date of Feb. 24, 2011 of provisional application Ser. No. 61/446,312; (v) is a continuation-in-part of Ser. No. 14/099,948 filed Dec. 7, 2013, which claims under 35 U.S.C. § 119(e)(1), the benefit of the filing date of Mar. 15, 2013 of provisional application Ser. No. 61/786,763, the benefit of the filing date of Dec. 7, 2012 of provisional application Ser. No. 61/734,809; (vi) is a continuation-in-part of U.S. patent application Ser. No. 14/214,304 filed Mar. 14, 2014, which claims under 35 U.S.C. § 119(e)(1), the benefit of the filing date of Mar. 15, 2013 of provisional application Ser. No. 61/786,687; and, (vii) is a continuation-in-part of U.S. patent application Ser. No. 13/222,931 filed Aug. 31, 2011, which claims under 35 U.S.C. § 119(e)(1), the benefit of the filing date of Aug. 31, 2010 of provisional application Ser. No. 61/378,910 and the benefit of the filing date of Feb. 24, 2011 of provisional patent application Ser. No. 61/446,042; and (viii) is a continuation-in-part of Ser. No. 14/746,382 filed Jun. 22, 2015, which is a continuation of U.S. patent application Ser. No. 13/403,287 filed Feb. 23, 2012 (issued as U.S. Pat. No. 9,074,422) and which claims, under 35 U.S.C. § 119(e)(1), the benefit of the filing date of Feb. 24, 2011 of U.S. provisional application Ser. No. 61/446,042, claims, the benefit of the filing date of Feb. 24, 2011 of U.S. provisional application Ser. No. 61/446,043, the benefit of the filing date of Feb. 24, 2011 of U.S. provisional application Ser. No. 61/446,040, the benefit of the filing date of Feb. 24, 2011 of U.S. provisional application Ser. No. 61/446,312, and which is a continuation-in-part of U.S. patent application Ser. No. 13/210,581 filed Aug. 16, 2011, (issued as U.S. Pat. No. 8,662,160), the entire disclosure of each of which are incorporated herein by reference.

This invention was made with Government support under Award DE-AR0000044 awarded by the Office of ARPA-E U.S. Department of Energy. The Government has certain rights in this invention.

The present invention relates to methods, apparatus and systems for delivering high power laser energy over long distances, while maintaining the power of the laser energy to perform desired tasks. In a particular, the present invention relates to providing high power laser energy to create and advance a borehole in the earth and to perform other tasks in the borehole.

In general, boreholes have been formed in the earth's surface and the earth, i.e., the ground, to access resources that are located at and below the surface. Such resources would include hydrocarbons, such as oil and natural gas, water, and geothermal energy sources, including hydrothermal wells. Boreholes have also been formed in the ground to study, sample and explore materials and formations that are located below the surface. They have also been formed in the ground to create passageways for the placement of cables and other such items below the surface of the earth.

The term borehole includes any opening that is created in the ground that is substantially longer than it is wide, such as a well, a well bore, a well hole, and other terms commonly used or known in the art to define these types of narrow long passages in the earth. Although boreholes are generally oriented substantially vertically, they may also be oriented on an angle from vertical, to and including horizontal. Thus, using a level line as representing the horizontal orientation, a borehole can range in orientation from 0° i.e., a vertical borehole, to 90°, i.e., a horizontal borehole and greater than 90° e.g., such as a heel and toe. Boreholes may further have segments or sections that have different orientations, they may be arcuate, and they may be of the shapes commonly found when directional drilling is employed. Thus, as used herein unless expressly provided otherwise, the "bottom" of the borehole, the "bottom" surface of the borehole and similar terms refer to the end of the borehole, i.e., that portion of the borehole farthest along the path of the borehole from the borehole's opening, the surface of the earth, or the borehole's beginning.

Advancing a borehole means to increase the length of the borehole. Thus, by advancing a borehole, other than a horizontal one, the depth of the borehole is also increased. Boreholes are generally formed and advanced by using mechanical drilling equipment having a rotating drilling bit. The drilling bit is extending to and into the earth and rotated to create a hole in the earth. In general, to perform the drilling operation a diamond tip tool is used. That tool must be forced against the rock or earth to be cut with a sufficient force to exceed the shear strength of that material. Thus, in conventional drilling activity mechanical forces exceeding the shear strength of the rock or earth must be applied to that material. The material that is cut from the earth is generally known as cuttings, i.e., waste, which may be chips of rock, dust, rock fibers and other types of materials and structures that may be created by the thermal or mechanical interactions with the earth. These cuttings are typically removed from the borehole by the use of fluids, which fluids can be liquids, foams or gases.

In addition to advancing the borehole, other types of activities are performed in or related to forming a borehole, such as, work over and completion activities. These types of activities would include for example the cutting and perforating of casing and the removal of a well plug. Well casing, or casing, refers to the tubulars or other material that are used to line a wellbore. A well plug is a structure, or material that is placed in a borehole to fill and block the borehole. A well plug is intended to prevent or restrict materials from flowing in the borehole.

Typically, perforating, i.e., the perforation activity, involves the use of a perforating tool to create openings, e.g. windows, or a porosity in the casing and borehole to permit the sought after resource to flow into the borehole. Thus, perforating tools may use an explosive charge to create, or drive projectiles into the casing and the sides of the borehole to create such openings or porosities.

The above mentioned conventional ways to form and advance a borehole are referred to as mechanical techniques, or mechanical drilling techniques, because they require a mechanical interaction between the drilling equipment, e.g., the drill bit or perforation tool, and the earth or casing to transmit the force needed to cut the earth or casing.

It has been theorized that lasers could be adapted for use to form and advance a borehole. Thus, it has been theorized that laser energy from a laser source could be used to cut rock and earth through spalling, thermal dissociation, melting, vaporization and combinations of these phenomena. Melting involves the transition of rock and earth from a solid to a liquid state. Vaporization involves the transition of rock and earth from either a solid or liquid state to a gaseous state. Spalling involves the fragmentation of rock from localized heat induced stress effects. Thermal dissociation involves the breaking of chemical bonds at the molecular level.

To date it is believed that prior to the inventions disclosed and taught in the patent applications upon which priority of the present application is based, no one has succeeded in developing and implementing these laser drilling theories to provide an apparatus, method or system that can advance a borehole through the earth using a laser, or perform perforations in a well using a laser. Moreover, to date it is believed that no one has developed the parameters, and the equipment needed to meet those parameters, for the effective cutting and removal of rock and earth from the bottom of a borehole using a laser, nor has anyone developed the parameters and equipment need to meet those parameters for the effective perforation of a well using a laser, nor has anyone developed the parameters and equipment need to meet those parameter for the effect use of a laser in workover, completion, decommissioning and other oil field related applications. Further is it believed that no one has developed the parameters, equipment or methods need to advance a borehole deep into the earth, to depths exceeding about 300 ft (0.09 km), 500 ft (0.15 km), 1000 ft, (0.30 km), 3,280 ft (1 km), 9,840 ft (3 km) and 16,400 ft (5 km), using a laser. In particular, it is believed that no one has developed parameters, equipments, or methods nor implemented the delivery of high power laser energy, i.e., in excess of 1 kW or more to advance a borehole within the earth.

While mechanical drilling has advanced and is efficient in many types of geological formations, it is believed that a highly efficient means to create boreholes through harder geologic formations, such as basalt and granite has yet to be developed. Thus, the present invention provides solutions to this need by providing parameters, equipment and techniques for using a laser for advancing a borehole in a highly efficient manner through harder rock formations, such as basalt and granite.

The environment and great distances that are present inside of a borehole in the earth can be very harsh and demanding upon optical fibers, optics, and packaging. Thus, there is a need for methods and an apparatus for the deployment of optical fibers, optics, and packaging into a borehole, and in particular very deep boreholes, that will enable these and all associated components to withstand and resist the dirt, pressure and temperature present in the borehole and overcome or mitigate the power losses that occur when transmitting high power laser beams over long distances. The present inventions address these needs by providing a long distance high powered laser beam transmission means.

A conventional drilling rig, which delivers power from the surface by mechanical means, must create a force on the rock that exceeds the shear strength of the rock being drilled. Although a laser has been shown to effectively spall and chip such hard rocks in the laboratory under laboratory conditions, and it has been theorized that a laser could cut such hard rocks at superior net rates than mechanical drilling, to date it is believed that prior to the inventions disclosed and taught in the patent applications upon which priority of the present application is based no one has developed the apparatus systems or methods that would enable the delivery of the laser beam to the bottom of a borehole that is greater than about 1,640 ft (0.5 km) in depth with sufficient power to cut such hard rocks, let alone cut such hard rocks at rates that were equivalent to and faster than conventional mechanical drilling.

Thus, an embodiment of the present invention addresses and provides solutions to these and other needs in the drilling arts by providing, among other things: the use of a fiber laser, disk laser, or high brightness semiconductor laser.

SUMMARY

It is desirable to develop systems and methods that provide for the delivery of high power laser energy to the bottom of a deep borehole to advance that borehole at a cost effective rate, and in particular, to be able to deliver such high power laser energy to drill through rock layer formations including granite, basalt, sandstone, dolomite, sand, salt, limestone, rhyolite, quartzite and shale rock at a cost effective rate. More particularly, it is desirable to develop systems and methods that provide for the ability to deliver such high power laser energy to drill through hard rock layer formations, such as granite and basalt, at a rate that is superior to prior conventional mechanical drilling operations. The present invention, among other things, solves these needs by providing the system, apparatus and methods taught herein.

Thus there is provided herein a high power laser drilling system for advancing a borehole the system having a source of high power laser energy, the laser source capable of providing a laser beam having at least 5 kW of power, the system further having a tubing assembly, the tubing assembly having at least 1000 feet of tubing and having a distal end and a proximal, the system further having a source of fluid for use in advancing a borehole. The components of the system are configured so that the proximal end of the tubing is in fluid communication with the source of fluid, whereby fluid is transported in association with the tubing.

Further there is provided the systems and methods provided herein wherein the laser source comprises a single laser, comprises two lasers and comprises a plurality of lasers is provided.

Moreover, there is provided a high power laser down hole system for performing down hole operations, the system having: a down hole assembly, wherein the down hole assembly is configured for operation within a bore hole; the down hole assembly having: a high power laser, capable of providing a high power laser beam: wherein the high power laser beam has at least about 5 kW of power, has a wavelength selected from the range of 455 nm to about 810 nm; a working fluid, the working fluid having an absorptivity for the laser beam; wherein the absorptivity is less than 0.001 1/cm; a bottom hole assembly, having laser optics and an opening for discharging the working fluid; the high power laser, the laser optics and the opening in optical communication; and, a cooling system for the high power laser; and, a conveying system for advancing the down hole assembly into a borehole.

Yet further there is provided methods, apparatus and systems having one or more of the following features: wherein the high power laser has a plurality of diode lasers; wherein the high power laser has a plurality of high brightness diode lasers; wherein the high power laser has a plurality of high brightness diode lasers; and wherein the laser beam has an $M^2$ of less than 2; wherein the high power laser has a plurality phase arrayed diode lasers; wherein the high power laser has a high brightness diode laser; and wherein the laser beam has a beam parameter of less than 100 mm millrad; wherein the high power laser has a high brightness diode laser; and wherein the laser beam has a beam parameter of less than 50 mm millrad; wherein the high power laser has a high brightness diode laser; and wherein the laser beam has a beam parameter of less than 15 mm millrad; wherein the power source is selected from the group consisting of an optical power source, a power cable, and a down hole electrical generator; wherein the cooling system used sorption to cool the laser; wherein the working fluid is a cooling fluid; wherein the conveying system is selected from the group consisting of coiled tubing and a drill-string; wherein the power source is selected from the group consisting of an optical power source, a electrical power cable, and a down hole electrical generator; wherein the cooling system is capable of maintaining the temperature of the high power laser below 50° C.; and, wherein the conveying system is selected from the group consisting of land based rigs, mobile land based rigs, fixed tower rigs, barge rigs, drill ships, jack-up platforms, and semi-submersible rigs; and having a power source for the high power laser, wherein the power source is selected from the group consisting of an optical power source, a electrical power cable, and a down hole electrical generator; wherein the cooling system has the working fluid at a temperature below the operating diode laser temperature; and, wherein the conveying system is selected from the group consisting of land based rigs, mobile land based rigs, fixed tower rigs, barge rigs, drill ships, jack-up platforms, coiled tubing, a drill-string and semi-submersible rigs.

Further there is provided a high power laser bottom hole assembly having: a high power laser, the high power laser having an array of diodes capable of providing a high power laser beam; the high power laser beam having at least about 5 kW of power, having an $M^2$ of less than 2, having a beam parameter of less than 100 mm millrad, and having a wavelength selected from the range of about 455 nm to about 810 nm; a cooling system for the high power laser; a channel for directing a working fluid; and, laser optics, whereby the high power laser and the laser optics are in optical communication, thereby providing the ability to direct the high power laser beam within the bottom hole assembly, out of the bottom hole assembly and to a down hole target.

Still further there is provided a high power laser system for performing down hole operations, the system having: a down hole assembly, wherein the down hole assembly is configured for operation within a bore hole; the down hole assembly having: a high power laser, capable of generating a high power laser beam: wherein the high power laser beam has at least about 5 kW of power, has an $M^2$ of less than 2, has a beam parameter of less than 100 mm millrad, and has a wavelength less than 810 nm; a source of power for the high power laser, wherein the source of power is selected from the group consisting of an optical power source, a power cable, and a down hole electrical generator; a working fluid, the working fluid having an absorptivity for the laser beam; wherein the absorptivity is less than 4% per inch; a bottom hole assembly, having laser optics and an opening for discharging the working fluid; the high power laser near to the bottom hole assembly, whereby the high power laser and the bottom hole assembly are in optical communication, thereby providing the ability to direct the high power laser beam within the bottom hole assembly, out of the opening and to a down hole target, whereby the laser beam and the working fluid are coincident in the opening; and, a means for conveying the down assembly into the borehole, said means selected from the group consisting of land based rigs, mobile land based rigs, fixed tower rigs, barge rigs, drill ships, jack-up platforms, and semi-submersible rigs.

Moreover, there is provided a method of performing down hole laser operations in a bore hole below the surface of the earth, the method having: lowering an assembly having a high power laser below the surface of the earth into a borehole; providing a source of power to the high power laser; generating below the surface of the earth in the borehole a high power laser beam having at least 5 kW of power and a wavelength less than 810 nm; directing the high power laser beam through optics, whereby the laser beam is shape into a predetermined pattern; and, directing the laser beam to a target in the borehole to perform a laser operation.

Still further there are provided methods, apparatus and systems having one or more of the following features: wherein the target is selected from the group consisting of a down hole plug, a production casing, a casing, a bore hole sidewall, and a bottom of a borehole; wherein the laser operation is selected from the group consisting of advancing the well bore, finishing the well bore, and work over activities; wherein the laser operation is selected from the group consisting of drilling, perforating, window cutting, pipe cutting, and plug removal; wherein generating below the surface of the earth in the borehole a high power laser beam having combining laser beams from a plurality of laser sources; wherein the high power laser has a diode laser; wherein the high power laser has a plurality of high brightness diode lasers; and wherein the laser beam has an $M^2$ of less than 2; wherein the high power laser has a plurality phase arrayed diode lasers; wherein the high power laser has a high brightness diode laser; and wherein the laser beam has a beam parameter of less than 100 mm millrad; wherein the high power laser has a high brightness diode laser; and wherein the laser beam has a beam parameter of less than 50 mm millrad; wherein the high power laser has a high brightness diode laser; and wherein the laser beam has a beam parameter of less than 15 mm millrad; wherein the power source is selected from the group consisting of an optical power source, a power cable, and a down hole electrical generator; having sorption cooling of the laser; delivering a working fluid to the target, wherein the working fluid has been selected to minimize the absorption of the laser beam; wherein the absorption of the laser beam by the working fluid is less than 0.001 1/cm; wherein the absorption of the laser beam by the working fluid is less than 4% per inch; wherein the absorption of the laser beam by the working fluid is less than 0.1% per inch; lowering the assembly from a field unit, the field unit selected from the group consisting of land based rigs, mobile land based rigs, fixed tower rigs, barge rigs, drill ships, jack-up platforms, and semi-submersible rigs; wherein the target is selected from the group consisting of the bottom of a borehole, the side wall of a borehole, a casing, a tubular, an interior surface of a tubular, an exterior surface of a tubular, and a subsea structure.

Still further there is provided a method of performing laser operations below the surface of the earth, the method having: lowering an assembly having a high power laser beam source below the surface of the earth to a depth within a borehole, the high power laser beam source having a plurality of lasers, wherein the lasers are capable of generating laser beams having waive lengths of less than 810 nm; providing a source of power to the high power laser source; generating below the surface of the earth in the borehole a plurality of laser beam having wavelengths of less than 810 nm; combining a plurality of the laser beams to form a single high power laser beam having at least 10 kW of power and a wavelength less than 810 nm; cooling the high power laser source to a temperature at or below 100° C.; and, directing the single high power laser beam to a target in the borehole to perform a laser operation.

Additionally, there are provided methods, apparatus and systems having one or more of the following features: wherein the single high power laser beam has a power of at least 10 kW; wherein the single high power laser beam has a power of at least 20 kW; wherein the laser operation is selected from the group consisting of cutting, heat treating, thermal processing, annealing, advancing a borehole, workover and completion, removing material, cleaning, milling, flow assurance, decommissioning, plugging, abandonment and perforating; wherein the cooling has sending a liquid downhole, the liquid having a temperature lower than an ambient temperature in the borehole at the depth of the high power laser source; wherein the power source is electrical, and the electrical optical efficiency of the high power laser is at least 10; and wherein the power source is electrical, and the electrical optical efficiency of the high power laser is at least 25%.

Further there is provided a method of performing down hole laser operations in a bore hole, the method having: providing a source of power to a high power laser beam source located at a depth within a borehole, the high power laser beam source having a laser; thereby generating a laser beam having a wavelength of less than 810 nm; cooling the laser, wherein the cooling has sending a fluid into the borehole, the fluid having a temperature lower than an ambient temperature within the borehole at the depth of the high power laser source; providing within the borehole at the depth of the high power laser source a high power laser beam having at least 5 kW of power and a wavelength less than 810 nm; shaping the high power laser beam into a predetermined shape; and, directing the high power laser beam to a target within the borehole to perform a laser operation at the depth within the borehole.

DESCRIPTION OF THE DRAWINGS AND THE PREFERRED EMBODIMENTS

Figure 1:
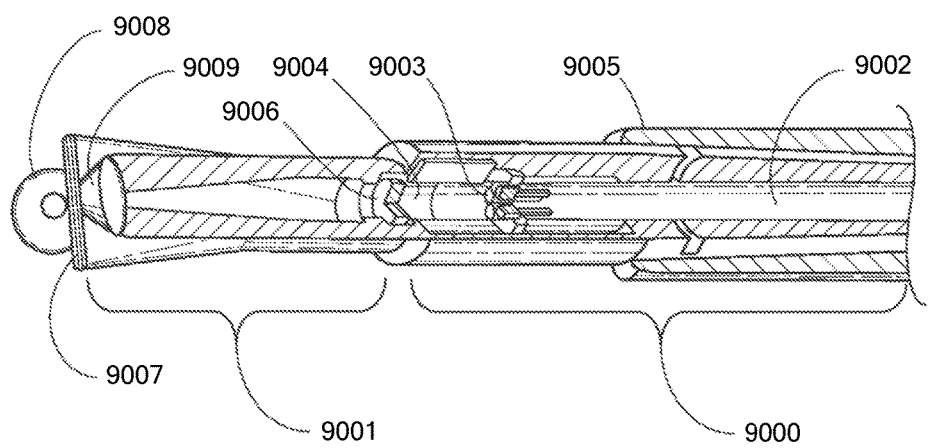
FIG. 1 is a perspective cutaway of a bottom hole assembly.

In general, embodiments of the present inventions relate to, among other things, methods, apparatus and systems for use in laser drilling of a borehole in the earth, and further, relate to equipment, methods and systems for the laser advancing of such boreholes deep into the earth and at highly efficient advancement rates. These highly efficient advancement rates are obtainable because the present invention provides for a means to get high power laser energy to the bottom of the borehole, even when the bottom is at great depths.

Thus, embodiments of the present inventions, by way of illustration, may find use in the generation, delivery, propagation and combinations and variations of these, of high power laser beams in difficult to access, harsh, remote, and extreme environments and conditions, such as the environments and conditions found, for example, in or associated with a borehole, in or associated with an exploration well, in or associated with a producing oil well, in or associated with a producing geothermal well, in or associated with a natural producing gas well, in or associated with a nuclear reactor, in the earth, in or associated with a pipe line, on the see floor, in or associated with a mine, and under the surface of a body of water.

In general, and by way of further illustration, embodiments of the present inventions relate to methods, apparatus and systems for the delivery of high power laser beams to a work surface to perform a laser operation on the work surface, such as, treating, fracturing, tunneling, weakening, welding, annealing, cutting, removing, milling, completing, monitoring, analyzing, drilling, penetrating, melting, ablating, spalling, vaporizing, cooking, charring, heating, perforating and combinations and various of these. The work surfaces, for example, may be roads, the bottom of a borehole, the side wall of a borehole, a casing, a tubular, an interior surface of a tubular, an exterior surface of a tubular, a subsea structure, the earth, bridge supports, dams, meat, animal and human tissue, food products, ice, rocks, rock faces, pipes, conduit, tubes, columns, wire, cables, girders, beams, buildings, concrete, reinforced concrete, rebar, metal, coal, ore, shale, tar sands, mineral containing materials, steel, tanks, and support structures. Thus, the present inventions relate to high power laser systems, high power lasers, and laser-mechanical tools and tool systems, for example, that are capable of providing at least about 1 kW, at least about 5 kW, at least about 10 kW, at least about 20 kW, at least about 50 kW, and at least about 100 kW of laser power to a remote work surface or target material in harsh environmental conditions, which systems and units may include for example drilling, workover and completion, decommissioning, cleaning, mining, ROV, and pigging systems and units.

Thus, in general, and by way of further illustration, embodiments of the present inventions relate to methods, apparatus and systems for the delivery of high power laser beams to a work surface, and in particular, a work surface that may be on a factory floor, may be in remote, hazardous, optically occluded and difficult to access locations, such as: oil wells, boreholes in the earth, pipelines, underground mines, natural gas wells, geothermal wells, surface mines, subsea, nuclear reactors, or in other environments. Further and in general, the present inventions relate to high power laser systems, tools, process and operations that may be used with, as a part of, or in conjunction with, systems, methods and tools for applying laser energy for performing laser applications and laser assisted applications such as cutting, heat treating, thermal processing, annealing, cladding, hard facing, welding, advancing a borehole, workover and completion, removing material, monitoring, cleaning, controlling, assembling, drilling, machining, powering equipment, milling, flow assurance, decommissioning, plugging, abandonment and perforating.

In general, embodiments of the present inventions relate to systems, methods and tools for applying directed energy for cutting, heat treating, thermal processing, annealing, cladding, hard facing, welding and removing material; by way of an isolated laser beam that may be transmitted within a fluid laser jet. Further, and in particular, these inventions relate to laser processing of objects located downhole in a borehole, associated with a borehole, or located under a body of water and would include, for example, the cutting, milling, perforating, and sectioning of such objects, including the perforating of boreholes into and through casing, cement and formations. These inventions still further relate to the advancing of boreholes in the earth, for example sandstone, limestone, basalt, salt, granite, shale, or the advancing of boreholes in other materials, that may or may not be found in the earth, such as for example concrete. The present inventions further relate to such methods and apparatus for laser assisted milling, cutting, flow assurance, decommissioning, plugging, abandonment and perforating activities in the exploration, production and development of natural resources, such as minerals, oil, gas and geothermal.

The high power laser may also be located near the laser tool, such as for example, when the tool and laser are associated with a remote operated vehicle ("ROV") or a laser PIG.

Thus, in general, and by way of example, there is provided in an embodiment a high efficiency laser drilling system for creating a borehole in the earth. As used herein the term "earth" should be given its broadest possible meaning (unless expressly stated otherwise) and would include, without limitation, the ground, all natural materials, such as rocks, and artificial materials, such as concrete, that are or may be found in the ground, including without limitation rock layer formations, such as, granite, basalt, sandstone, dolomite, sand, salt, limestone, rhyolite, quartzite and shale rock.

In an embodiment in general and by way of example, there is provided a source of electrical power, which provides electrical power by cables to a laser and a chiller for the laser. The laser provides a laser beam, i.e., laser energy. A source of fluid is provided. The fluid is conveyed by fluid conveyance means to the spool of coiled tubing. The spool of coiled tubing is rotated to advance and retract the coiled tubing. The coiled tubing also contains a means to convey the fluid along the entire length of the coiled tubing to the bottom hole assembly. Additionally, there is provided a support structure, which holds an injector, to facilitate movement of the coiled tubing in the borehole. Further other support structures may be employed for example such structures could be derrick, crane, mast, tripod, or other similar type of structure or hybrid and combinations of these. As the borehole is advance to greater depths from the surface, the use of a diverter, a blow out preventer (BOP), and a fluid and/or cutting handling system may become necessary. The coiled tubing is passed from the injector through the diverter, the BOP, a wellhead and into the borehole. The fluid is conveyed to the bottom of the borehole. At that point the fluid exits at or near the bottom hole assembly and is used, among other things, to carry the cuttings, which are created from advancing a borehole, back up and out of the borehole. Thus, the diverter directs the fluid as it returns carrying the cuttings to the fluid and/or cuttings handling system through a connector. This handling system is intended to prevent waste products from escaping into the environment and separates and cleans waste products and either vents the cleaned fluid to the air, if permissible environmentally and economically, as would be the case if the fluid was nitrogen, or returns the cleaned fluid to the source of fluid, or otherwise contains the used fluid for later treatment and/or disposal. The BOP serves to provide multiple levels of emergency shut off and/or containment of the borehole should a high-pressure event occur in the borehole, such as a potential blow-out of the well. The BOP is affixed to the wellhead. The wellhead in turn may be attached to casing. It is understood that these components may be used and will vary based upon the depth, type, and geology of the borehole, as well as, other factors. The downhole end of the coiled tubing is connected to the bottom hole assembly. The bottom hole assembly contains optics for delivering the laser beam to its intended target. The bottom hole assembly, for example, also contains means for delivering the fluid. The high power laser is located near the laser tool.

Thus, in general in this embodiment this system operates to create and/or advance a borehole by having the laser create laser energy in the form of a laser beam. The laser beam is then directed toward the surfaces of the earth and/or borehole. Upon contacting the surface of the earth and/or borehole the laser beam has sufficient power to cut, or otherwise effect, the rock and earth creating and/or advancing the borehole. The laser beam at the point of contact has sufficient power and is directed to the rock and earth in such a manner that it is capable of borehole creation that is comparable to or superior to a conventional mechanical drilling operation. Depending upon the type of earth and rock and the properties of the laser beam this cutting occurs through spalling, thermal dissociation, melting, vaporization and combinations of these phenomena.

Although not being bound by the present theory, it is presently believed that the laser material interaction entails the interaction of the laser and a fluid or media to clear the area of laser illumination. Thus the laser illumination creates a surface event and the fluid impinging on the surface rapidly transports the debris, i.e. cuttings and waste, out of the illumination region. The fluid is further believed to remove heat either on the macro or micro scale from the area of illumination, the area of post-illumination, as well as the borehole, or other media being cut, such as in the case of perforation.

The fluid then carries the cuttings up and out of the borehole. As the borehole is advanced the coiled tubing is unspooled and lowered further into the borehole. In this way the appropriate distance between the bottom hole assembly and the bottom of the borehole can be maintained. If the bottom hole assembly needs to be removed from the borehole, for example to case the well, the spool is wound up, resulting in the coiled tubing being pulled from the borehole. Additionally, the laser beam may be directed by the bottom hole assembly or other laser directing tool that is placed down the borehole to perform operations such as perforating, controlled perforating, cutting of casing, and removal of plugs. This system may be mounted on readily mobile trailers or trucks, because its size and weight are substantially less than conventional mechanical rigs.

A laser may be conveyed into the wellbore by a conduit made of coiled tubing or rigid drill-string. A power cable may be provided. A circulation system may also be provided. The circulation system may have a rigid or flexible tubing to send a liquid or gas downhole. A second tube may be used to raise the rock cuttings up to the surface. Additional tubing in the conduit may send a lower temperature liquid downhole than ambient temperature at a depth to cool the laser in the conduit.

Figure 2:
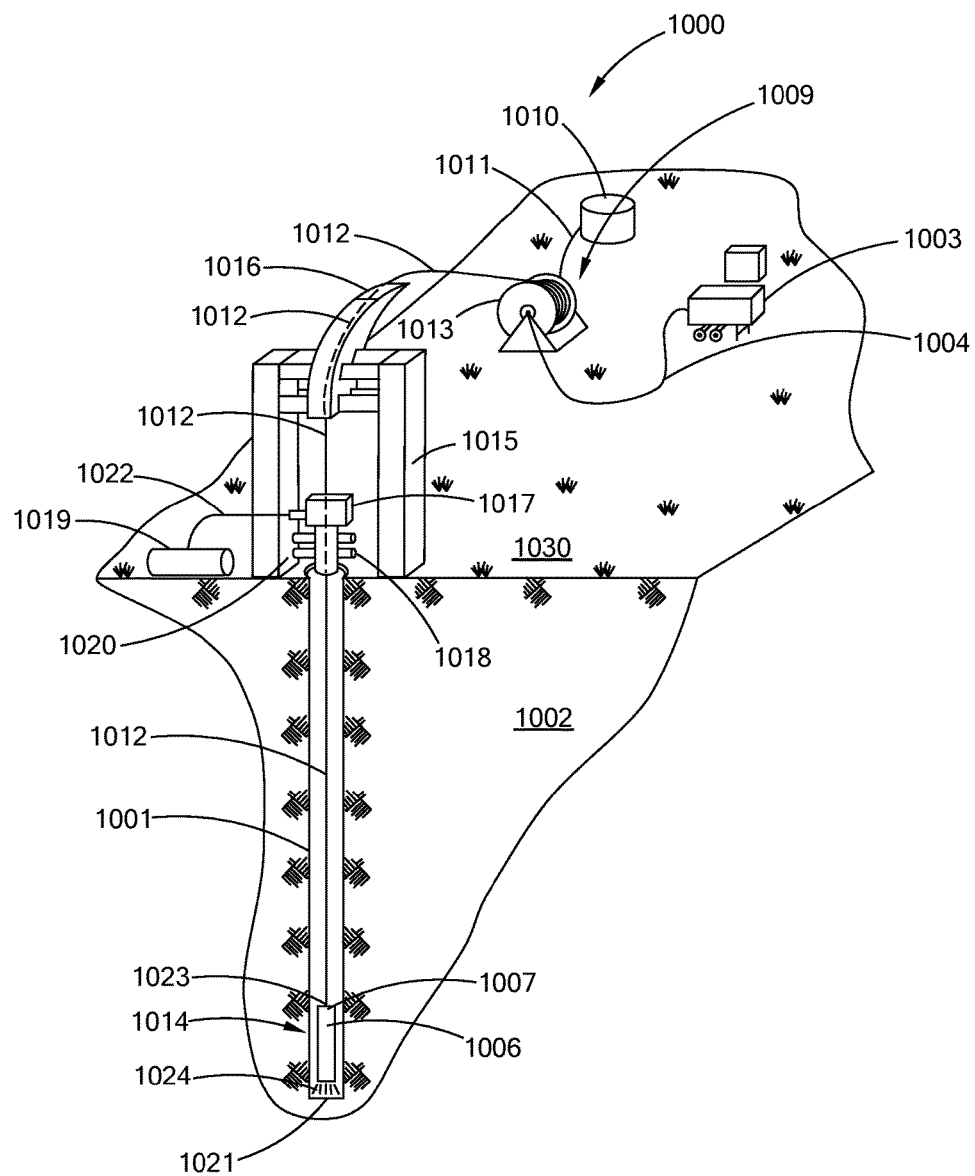
FIG. 2 is a cross sectional view of the earth, a borehole and an example of a system of the present invention for advancing a borehole.

Thus, in general, and by way of example, there is provided in FIG. 2 a high efficiency laser drilling system 1000 for creating a borehole 1001 in the earth 1002. As used herein the term "earth" should be given its broadest possible meaning (unless expressly stated otherwise) and would include, without limitation, the ground, all natural materials, such as rocks, and artificial materials, such as concrete, that are or may be found in the ground, including without limitation rock layer formations, such as, granite, basalt, sandstone, dolomite, sand, salt, limestone, rhyolite, quartzite and shale rock.

FIG. 2 provides a cut away perspective view showing the surface of the earth 1030 and a cut away of the earth below the surface 1002. In general and by way of example, there is provided a source of electrical power 1003, which provides electrical power by cable 1004 to a laser 1006 and a cooling system, e.g., chiller 1007 for the laser 1006. The laser provides a laser beam. A spool of coiled tubing 1009 and a source of fluid 1010 is provided. The fluid is conveyed by fluid conveyance means 1011 to the spool of coiled tubing 1009.

One or more lasers may be positioned downhole, i.e., down the borehole. Thus, by way of further example, the laser may be maintained at a certain distance from the material, such as rock to be acted upon. When the laser is deployed downhole, the laser may generally be shaped and/or sized to fit in the borehole. Some lasers may be better suited than others for use downhole. For example, the size of some lasers may deem them unsuitable for use downhole, however, such lasers may be engineered or modified for use downhole. Similarly, the power or cooling of a laser may be modified for use downhole.

Thus, the drilling system 1000 includes a cooling system 1007. The cooling system may generally function to cool the laser. For example, the cooling system may cool the downhole laser 1006, for example to a temperature below the ambient temperature or to an operating temperature of the laser. Further, the laser may be cooled using sorption cooling to the operating temperature of, for example, a diode laser. A liquid at a lower temperature may be used for cooling when a temperature higher than the operating diode laser temperature is reached to cool the laser.

The spool of coiled tubing 1009 is rotated to advance and retract the coiled tubing 1012. Thus, the cable 1004 and the fluid conveyance means 1011 are attached to the spool of coiled tubing 1009 by means of rotating coupling means 1013. The coiled tubing 1012 has at its distal end a bottom hole assembly, 1014. The coiled tubing 1012 contains a means to convey the fluid along the entire length of the coiled tubing 1012 and the cable 1004 to the bottom hole assembly 1014.

Additionally, there is provided a support structure 1015, which holds an injector 1016, to facilitate movement of the coiled tubing 1012 in the borehole 1001. Further other support structures may be employed for example such structures could be derrick, crane, mast, tripod, or other similar type of structure or hybrid and combinations of these. As the borehole is advance to greater depths from the surface 1030, the use of a diverter 1017, a blow out preventer (BOP) 1018, and a fluid and/or cutting handling system 1019 may become necessary. The coiled tubing 1012 is passed from the injector 1016 through the diverter 1017, the BOP 1018, a wellhead 1020 and into the borehole 1001.

The fluid is conveyed to the bottom 1021 of the borehole 1001. At that point the fluid exits at or near the bottom hole assembly 1014 and is used, among other things, to carry the cuttings, which are created from advancing a borehole, back up and out of the borehole. Thus, the diverter 1017 directs the fluid as it returns carrying the cuttings to the fluid and/or cuttings handling system 1019 through connector 1022. This handling system 1019 is intended to prevent waste products from escaping into the environment and separates and cleans waste products and either vents the cleaned fluid to the air, if permissible environmentally and economically, as would be the case if the fluid was nitrogen, or returns the cleaned fluid to the source of fluid 1010, or otherwise contains the used fluid for later treatment and/or disposal.

The BOP 1018 serves to provide multiple levels of emergency shut off and/or containment of the borehole should a high-pressure event occur in the borehole, such as a potential blow-out of the well. The BOP is affixed to the wellhead 1020. The wellhead in turn may be attached to casing. For the purposes of simplification the structural components of a borehole such as casing, hangers, and cement are not shown. It is understood that these components may be used and will vary based upon the depth, type, and geology of the borehole, as well as, other factors.

The downhole end 1023 (distal end) of the coiled tubing 1012 is connected to the bottom hole assembly 1014. The bottom hole assembly 1014 contains optics for delivering the laser beam 1024 to its intended target, in the case of FIG. 2, the bottom 1021 of the borehole 1001. The bottom hole assembly 1014, for example, also contains means for delivering the fluid.

The laser may be any high powered laser that is capable of providing sufficient energy to perform the desired functions. The laser source can be for example a single mode laser or low order multi-mode laser with a low $M^2$ to facilitate launching into a small core optical fiber, i.e. about 50 microns. Examples of a laser source include fiber lasers, chemical lasers, disk lasers, thin slab lasers, high brightness diode lasers, as well as, the spectral beam combination of these laser sources or a coherent phased array laser of these sources to increase the brightness of the individual laser source.

The laser source may be a low order mode source ($M^2<2$) so it can be focused into an optical fiber with a mode diameter of <100 microns. Optical fibers with small mode field diameters ranging from 50 microns to 6 microns have the lowest transmission losses.

Thus, the laser source should have total power of at least about 1 kW, from about 1 kW to about 20 kW, from about 10 kW to about 20 kW, at least about 10 kW, and preferably about 20 or more kW. Moreover, combinations of various lasers may be used to provide the above total power ranges. Further, the laser source may have beam parameters in mm millirad as large as is feasible with respect to bendability and manufacturing substantial lengths of the fiber, thus the beam parameters may be less than about 100 mm millirad, from single mode to about 50 mm millirad, less than about 50 mm millirad, less than about 15 mm millirad, and most preferably about 12 mm millirad. Further, the laser source may have at least a 10% electrical optical efficiency, at least about 50% optical efficiency, at least about 70% optical efficiency, whereby it is understood that greater optical efficiency, all other factors being equal, is preferred, and preferably at least about 25%. The laser source can be run in either pulsed or continuous wave (CW) mode. The laser source may be capable of being fiber coupled.

For cutting casing, removal of plugs and perforation operations the laser may be any of the above referenced lasers, and it may further be any smaller lasers that would be only used for workover and completion downhole activities.

In addition configurations of lasers for use in a high efficiency laser systems are contemplated. Thus, Laser selection may generally be based on the intended application or desired operating parameters. Average power, specific power, irradiance, operation wavelength, pump source, beam spot size, exposure time, and associated specific energy may be considerations in selecting a laser. The material to be drilled, cut and both, such as rock formation type, may also influence laser selection. For example, the type of rock may be related to the type of resource being pursued. Hard rocks such as limestone and granite may generally be associated with hydrothermal sources, whereas sandstone and shale may generally be associated with gas or oil sources. Thus by way of example, the laser may be a solid-state laser, it may be a gas, chemical, dye or metal-vapor laser, or it may be a semiconductor laser. Further, the laser may produce a kilowatt level laser beam, and it may be a pulsed laser. The laser further may be a Nd:YAG laser, a $CO_2$ laser, a diode laser, such as an infrared diode laser, or a fiber laser, such as a ytterbium-doped multi-clad fiber laser. The fiber laser is doped with an active gain medium comprising rare earth elements, such as holmium, erbium, ytterbium, neodymium, dysprosium, praseodymium, thulium or combinations thereof. Combinations of one or more types of lasers may be implemented.

In use, one or more laser beams generated or illuminated by the one or more lasers may spall, vaporize or melt material, such as rock. The laser beam may be pulsed by one or a plurality of waveforms or it may be continuous. The laser beam may generally induce thermal stress in a rock formation due to characteristics of the material, such as rock including, for example, the thermal conductivity. The laser beam may also induce mechanical stress via superheated steam explosions of moisture in the subsurface of the rock formation. Mechanical stress may also be induced by thermal decompositions and sublimation of part of the in situ mineral of the material. Thermal and/or mechanical stress at or below a laser-material interface may promote spallation of the material, such as rock. Likewise, the laser may be used to effect well casings, cement or other bodies of material as desired. A laser beam may generally act on a surface at a location where the laser beam contacts the surface, which may be referred to as a region of laser illumination. The region of laser illumination may have any preselected shape and intensity distribution that is required to accomplish the desired outcome, the laser illumination region may also be referred to as a laser beam spot. Boreholes of any depth and/or diameter may be formed, such as by spalling multiple points or layers. Thus, by way of example, consecutive points may be targeted or a strategic pattern of points may be targeted to enhance laser/rock interaction. The position or orientation of the laser or laser beam may be moved or directed so as to intelligently act across a desired area such that the laser/material interactions are most efficient at causing rock removal.

A single high power laser may be utilized in the system, or the system may have two or three high power lasers, or more. High power solid-state lasers, specifically semiconductor lasers and fiber lasers are preferred, because of their short start up time and essentially instant-on capabilities. The high power lasers for example may be fiber lasers or semiconductor lasers having 10 kW, 20 kW, 50 kW or more power and, which emit laser beams with wavelengths in the range from about 455 nm (nanometers) to about 2100 nm, preferably in the range about 800 nm to about 1600 nm, about 1060 nm to 1080 nm, 1530 nm to 1600 nm, 1800 nm to 2100 nm, and more preferably about 1064 nm, about 1070-1080 nm, about 1360 nm, about 1455 nm, 1490 nm, or about 1550 nm, or about 1900 nm (wavelengths in the range of 1900 nm may be provided by Thulium lasers).

Examples of lasers, and in particular solid-state lasers, such as fibers lasers, are set forth in US Patent Application Publication Numbers 2010/0044106, 2010/0044103, 2010/0044105 and 2010/0215326 and in pending U.S. patent application Ser. No. 12/840,978, the entire disclosures of each of which are incorporated herein by reference. Further diode lasers, and for example, such lasers having a wavelength of from about 0.9 microns to 2 microns may be utilized.

One or more lasers may be positioned downhole, i.e., down the borehole. Thus, depending upon the specific requirements and operation parameters, the laser may be located at any depth within the borehole. For example, the laser may be maintained relatively close to the surface, it may be positioned deep within the borehole, it may be maintained at a constant depth within the borehole or it may be positioned incrementally deeper as the borehole deepens. Thus, by way of further example, the laser may be maintained at a certain distance from the material, such as rock to be acted upon. When the laser is deployed downhole, the laser may generally be shaped and/or sized to fit in the borehole. Some lasers may be better suited than others for use downhole. For example, the size of some lasers may deem them unsuitable for use downhole, however, such lasers may be engineered or modified for use downhole. Similarly, the power or cooling of a laser may be modified for use downhole.

Systems and methods may generally include one or more features to protect the laser. This become important because of the harsh environments, both for surface units and downhole units. Thus, In accordance with one or more embodiments, a borehole drilling system may include a cooling system. The cooling system may generally function to cool the laser. For example, the cooling system may cool a downhole laser, for example to a temperature below the ambient temperature or to an operating temperature of the laser. Further, the laser may be cooled using sorption cooling to the operating temperature of the diode laser, for example, for an infrared diode laser about 20° C. to about 100° C. For a fiber laser its operating temperature may be between about 20° C. to about 50° C. A liquid at a lower temperature may be used for cooling when a temperature higher than the operating diode laser temperature is reached to cool the laser.

Heat may also be sent uphole, i.e., out of the borehole and to the surface, by a liquid heat transfer agent. The liquid transfer agent may then be cooled by mixing with a lower temperature liquid uphole. One or multiple heat spreading fans may be attached to the laser diode to spread heat away from the infrared diode laser. Fluids may also be used as a coolant, while an external coolant may also be used.

In downhole applications the laser may be protected from downhole pressure and environment by being encased in an appropriate material. Such materials may include steel, titanium, diamond, tungsten carbide and the like. The fiber head for an infrared diode laser or fiber laser may have an infrared transmissive window. Such transmissive windows may be made of a material that can withstand the downhole environment, while retaining transmissive qualities. One such material may be sapphire or other material with similar qualities. One or more infrared diode lasers or fiber lasers may be entirely encased by sapphire. By way of example, an infrared diode laser or fiber laser may be made of diamond, tungsten carbide, steel, and titanium other than the part where the laser beam is emitted.

In the downhole environment it is further provided by way of example that the infrared diode laser or fiber laser is not in contact with the borehole while drilling. For example, a downhole laser may be spaced from a wall of the borehole.

This distal, or remote, laser uses the laser energy from the transmission or first laser to create a lasing action, e.g., pump and thus generates a laser beam at a second wave length (range of wavelengths). The remote laser is optically associated with a high power laser tool, which receives, shapes and configures this second laser beam for launching from the tool, through free space, toward a work surface or target material. This second wavelength provides for good, or preferably the optimum, ability to minimize losses, as the second laser beam is propagated through the free space medium, after being launched from the laser tool, to the target material or work surface.

Figure 5A:
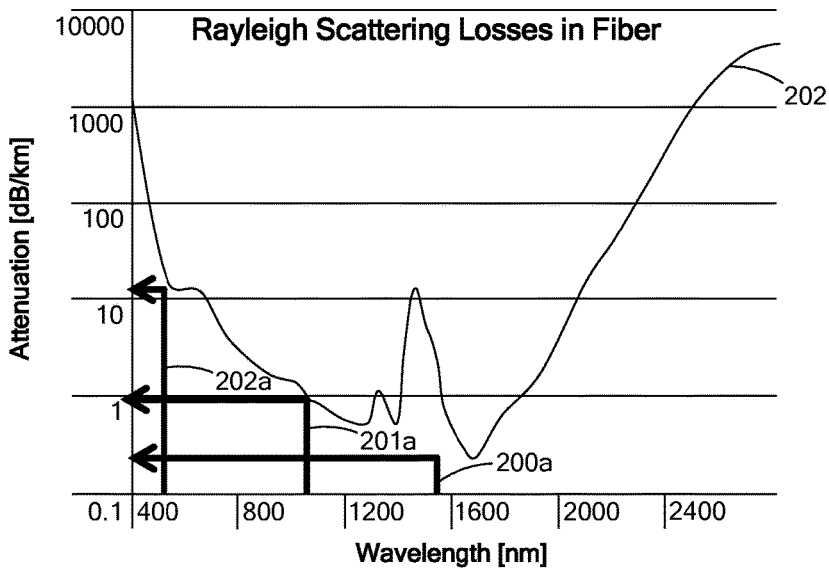
FIGS. 5A and 5B are charts showing spectra in accordance with the present inventions.
Figure 5B:
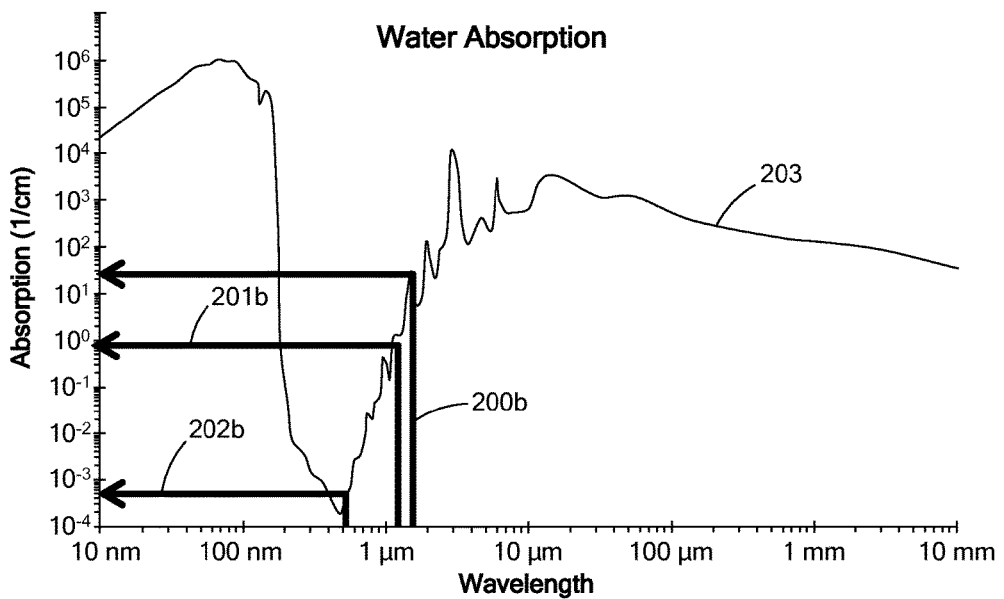

Thus, turning to FIGS. 5A and 5B there are shown graphs of the absorption or losses of various laser wavelengths over particular conditions along the optical path of a system. In FIG. 5A the plot 202 shows the Rayleigh scattering losses in a transmission fiber for various wavelengths. Arrow 200a shows the loss for 1550 nm (<0.25 dB/km), arrow 201a shows the loss for 1070 nm (0.6 dB/km) and arrow 202a shows the loss for 532 nm (10 dB/km). Thus, for long distance transmission 1550 nm wavelength would be the optimal wavelength of those called out in the figure. In FIG. 5B the plot 203 shows the water absorption for various wavelengths. Arrow 200b shows the absorption for 1550 nm (>95%/mm), arrow 201b shows the absorption for 1070 nm (>25%/inch), and arrow 201c shows the absorption for 532 nm (>0.1%/inch). Thus, for transmission through a free space environment having water 532 nm would the optimal wavelength of those called out in the figure. This illustrates an example of one of the paradigms that is present where the optimum wave length for long distance transmission is the worst wavelength for delivery through a particular free space environment of use. Although, 1550 nm, 1070 nm, and 532 nm wavelengths were called out in these figures to illustrate the relationship between competing factors over the optical path. The plots 202 and 203 show that other wavelengths may be optimal or desirable for use. Additionally, it is noted that the chart of FIG. 5A, also shows impurity vibrational absorption states. More specifically, the peak from 1300 nm to 1600 nm is an OH— absorption band. Preferably, an ultra pure fiber can be used to transmit the laser, which would eliminate such impurities and their related absorption peak would not be present.

Figure 4:
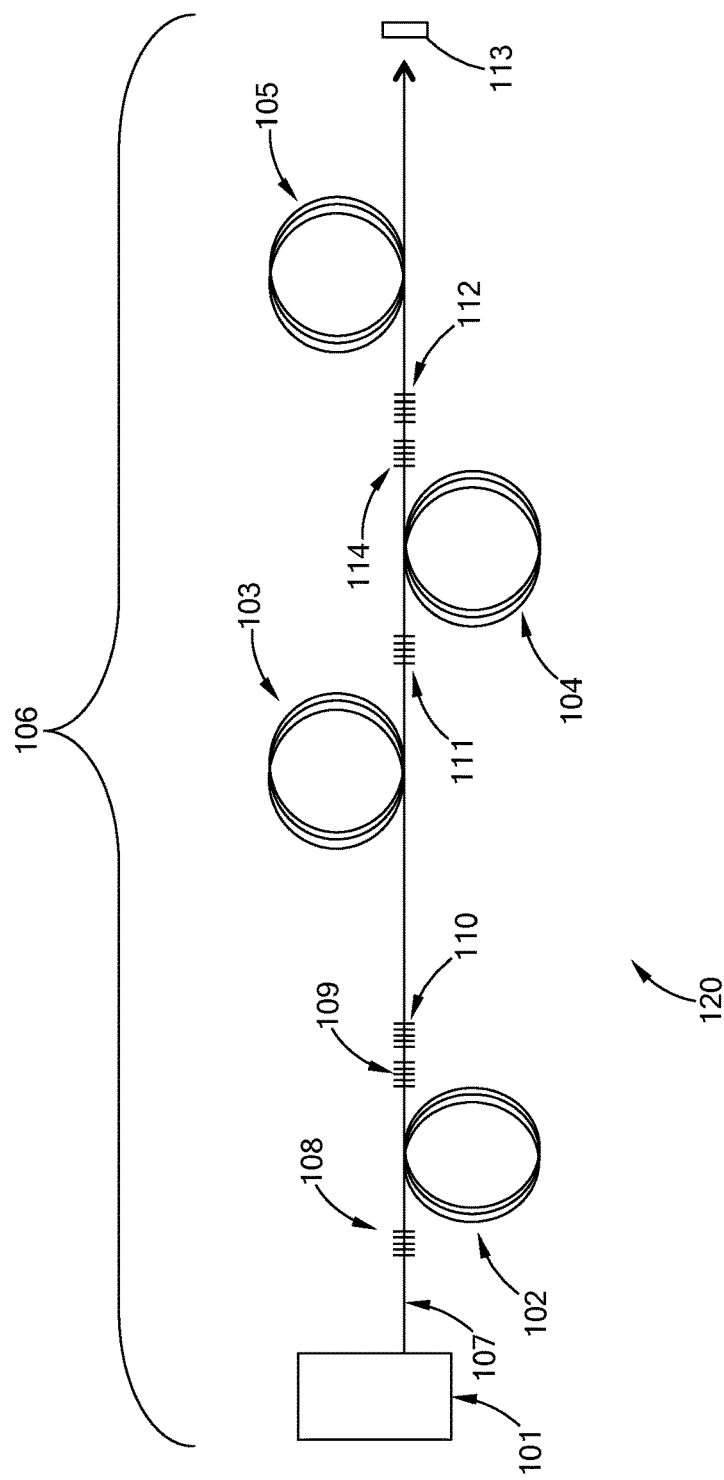
FIG. 4 is a schematic view of a laser conversion system of the present invention in accordance with the present inventions.

Turning to FIG. 4 there is provided an embodiment of an optical path multi-laser system 120, for providing laser energy to a remote location, such as a borehole deep within the earth. There is provided a first laser 101, a second laser 102, a long distance transmission fiber 103, a third laser 104, and a delivery fiber 105, which delivers the laser beam to a target 113, through free space along the optical path, such as a surface of a borehole. The system further has nested gratings or external broadband mirrors 108, 109, an HR grating or mirror 110, an HR grating 111, partially reflective grating 114, and an HR grating or mirror 112. In this embodiment the lasers are designed to provide specific wavelengths to address requirements along the optical path 106. The optical path 106 would include all elements that the laser beam is intended to pass through, including free space, along its intended path from the primary or first laser 101 until it strikes the intended target upon which the laser operation is to be performed. It is further noted that the length of the optical path would also include the length of the path that the laser beam takes between reflective gratings when in the second or third laser.

Laser 101 is a surface unit that has a good conversion of electrical energy to optical energy, and has the requisite reliability and robustness to be present at for example a drill site, on a drill ship, or in a nuclear or chemical facility. Laser 101 provides a first laser beam along the optical path 106. In the embodiment of FIG. 4, this first laser beam is a 20 kW laser beam at a wavelength of 1070 nm. The wavelength and power of the first laser beam is selected, and is based upon the requirements and outputs of the other lasers, and environments, along the optical path 106.

The wavelength of the first laser beam provided by the first laser 101 along the optical path 106, relates to and should meet the requirements of the second laser 102 along the optical path 106. In turn the second laser beam provided by the second laser 102, relates to and should meet the requirements of the third laser 104 along the optical path 106. If additional lasers, and wavelengths are utilized along the optical paths similar relationships amongst the laser should be present. Thus, in a multi-laser system, having n lasers positioned serially along the optical path, the wavelength of the first laser, e.g., the primary laser, will be based upon, or selected in part, based upon the requirements of the other lasers, and may include the requirements of the nth laser along the optical path.

The first laser 101 is a 1070 nm fiber laser pump with broad spectral characteristics. The first laser beam, having a 1070 nm wavelength, exits laser 101, e.g., is launched into optical fiber 107 and travels to laser 102, where it drives, pumps, or otherwise causes laser 102 to propagate a second laser beam, having a wavelength of 1550 nm, which is launched into the long distance transition fiber 103. Laser 102 is a 7th order Raman converter with a distal pump reflector. It has a 7th order nested grating or an external broadband mirror 108, on the proximal end of a 100 m conversion fiber having a core that is matched to the fiber laser core, and a 7th order nested grating or an external broadband mirror 109 and a 1070 nm HR grating or mirror 110 on the distal end of that conversion fiber.

In this manner the 1070 nm wavelength laser beam is converted to a second laser beam having a 1550 nm wavelength laser beam by the second laser 102. Thus, this conversion of the first laser beam to the longer wavelength of the second laser beam may be referred to as a conversion, and a conversion along the optical path of the laser beam in the laser system 120.

The 1550 nm laser wavelength is selected for the purpose of minimizing losses over long distance fiber transmission of the laser beam. By way of comparison the 1070 nm wavelength laser beam would have about 0.6 dB/km losses when being transmitted through the long distance transmission fiber 103, and the 1550 nm wavelength would have substantially smaller losses of about less than 0.25 dB/km when being transmitted through the long distance transmission fiber 103, which is about 5 km long. Thus, one of the purposes of selecting and providing a 1550 nm wavelength laser beam is to address, manage or mitigate the environmental or systems requirement to minimize power losses over long distance fiber transmissions.

The 1550 nm wavelength laser beam travels along the 5 km of transmission fiber 103 to laser 104, where it has a power of about 13 kW, and drives, pumps, or otherwise causes laser 104 to propagate a third laser beam having a wavelength of 810 nm. Laser 104 is a cladding pumped Thulium laser with Germania doping. It has an 810 nm HR grating on the proximal end of a 35 m conversion fiber, which has the same secondary cladding diameter as the transmission fiber 103 core diameter, and an 810 nm 5% R grating 114 and a 1550 nm HR grating or mirror 112 on the distal end of the 35 m conversion fiber. The 810 nm laser beam is launched from laser 104 into and travels along the delivery fiber 105. The delivery fiber 105 is connected to a downhole laser tool (not shown in the figure) where the tool launches the laser beam into the borehole toward the borehole surface to perform a laser operation such as advancing the borehole, perforating, cutting a window, removing a plug or other downhole operations, including workover and completion operations. In this manner the second laser beam having a wavelength of 1550 nm is converted, by the third laser 104 to a third laser beam, having a wavelength of 810 nm and a power of about 9.9 kW. The 810 nm wavelength is selected to provide the ability to use water as a delivery medium, while minimizing power losses. Thus, a laser water jet could be used, with minimal absorption, (and thus minimal power loss), by the water, to transport the laser beam through the fluids present in the borehole, e.g. through the free space environment of the borehole along the optical path. For example, the 810 nm wavelength laser beams has minimal absorption, e.g., power loss, in water, about 4%/inch, when compared to the 100%/inch absorption of the 1550 nm wavelength laser beam and the >20%/inch absorption of the 1070 nm wavelength laser beam.

Figure 6:
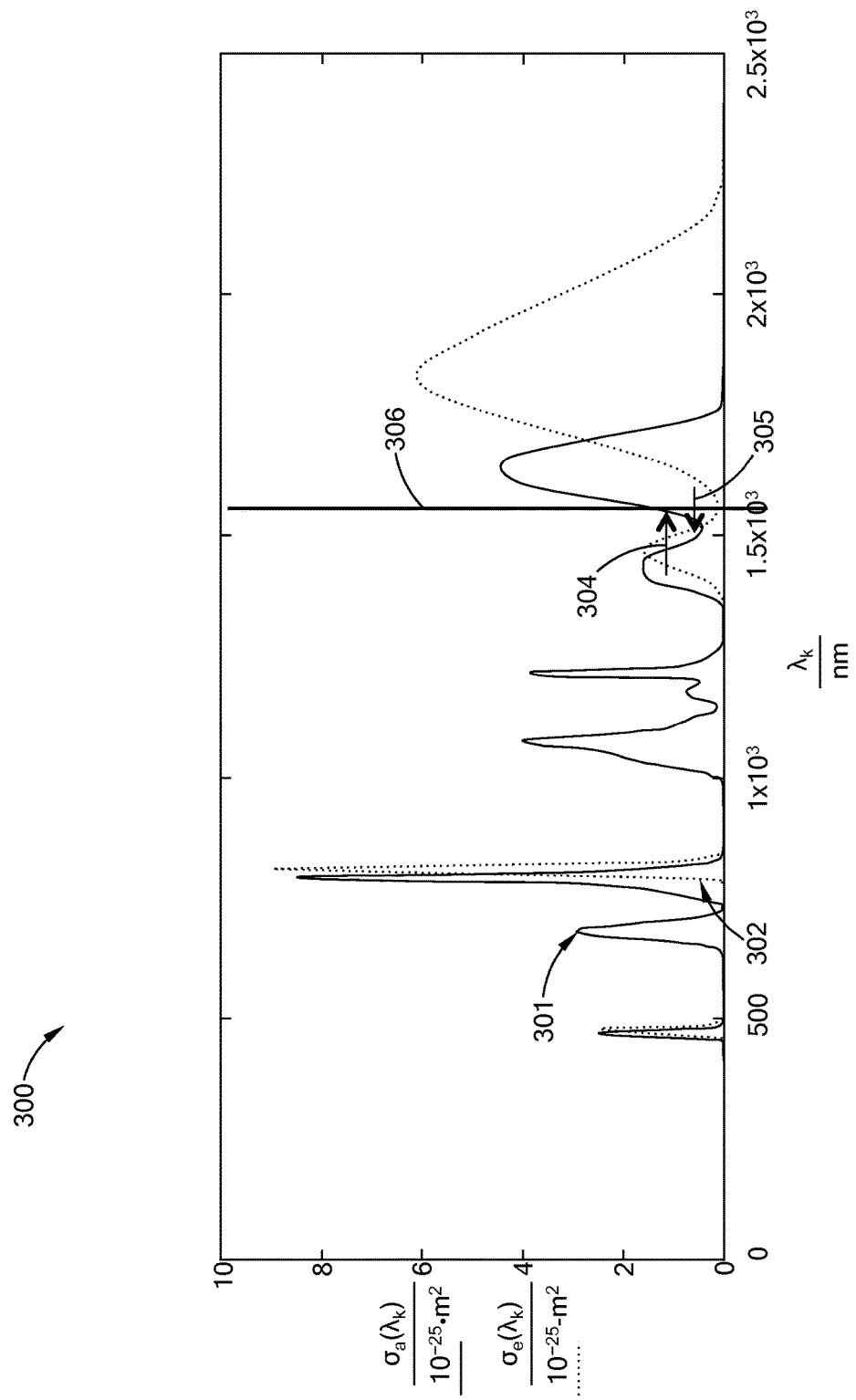
FIG. 6 is a chart showing spectra in accordance with the present inventions.

Turning to FIG. 6, there is shown a graph showing the absorption characteristics of a Thulium doped fiber. In order to pump the upconversion band, it is necessary to find a dopant for the fiber than can effectively shift the absorption spectrum at 1600 nm to a shorter wavelength while simultaneously shifting the excited state absorption band at 1470 nm to a longer wavelength. Line 306 shows 1550 nm and indicates the amount of wavelength shift required, as illustrated by arrows 304, 305.

Figure 7:
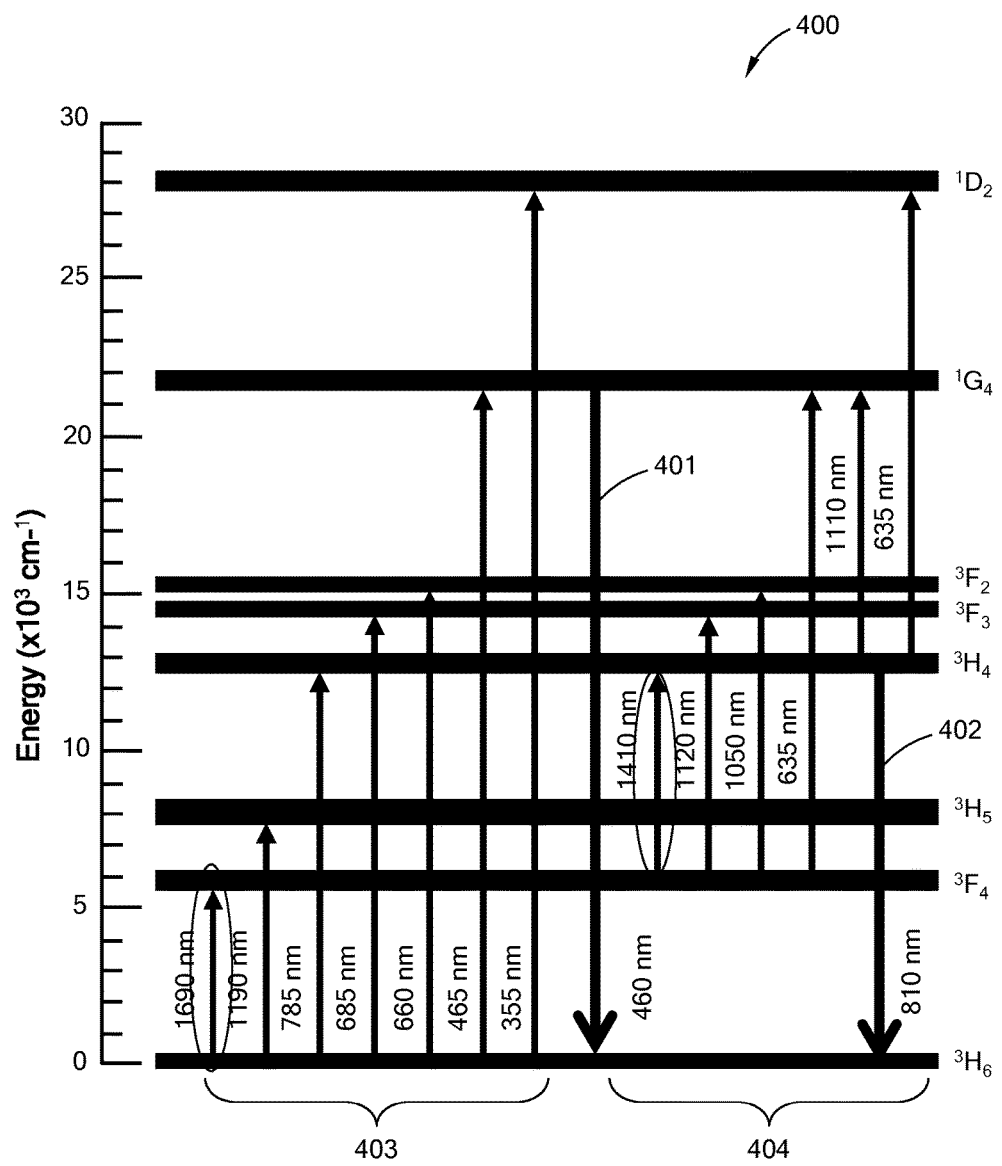
FIG. 7 is schematic of energy levels and transitions in accordance with the present inventions.

Turning to FIG. 7, there is shown a chart 400 of Thulium energy levels. The chart shows ground state absorptions 403 (upward arrows) and excited state absorptions 404 (upward arrows) for particular wavelengths (as illustrated in the figure). Arrows 401 and 402 show emissions at wavelengths 460 nm and 810 nm (which wavelengths have minimal absorption by water, see FIG. 5B). Thulium rare earth ion upconversion lasers can convert three 1070 nm photons to one 460 nm photo, or they it can convert one 1690 nm photon and one 1480 nm photon to one 810 nm photon. Further, a Thulium core fiber that is doped with Germanium can convert two 1550 nm photons to 810 nm photons. A Thulium core fiber can be doped with Alumina and convert one photon in the 1400s nm wavelength range, and one photon in the 1500s nm wavelength range or one photon in the 1600s nm range, to 810 nm. Thus, a laser source providing multiple wavelengths in the 1400s, 1500s and 1600s nm ranges can simultaneously provide these multiple wavelength laser beams to a Thulium fiber conversion laser to produce a laser beam at 810 nm. As seen in FIG. 5A, these pump wavelengths have low Rayleigh scattering losses over long distances.

Figure 8:
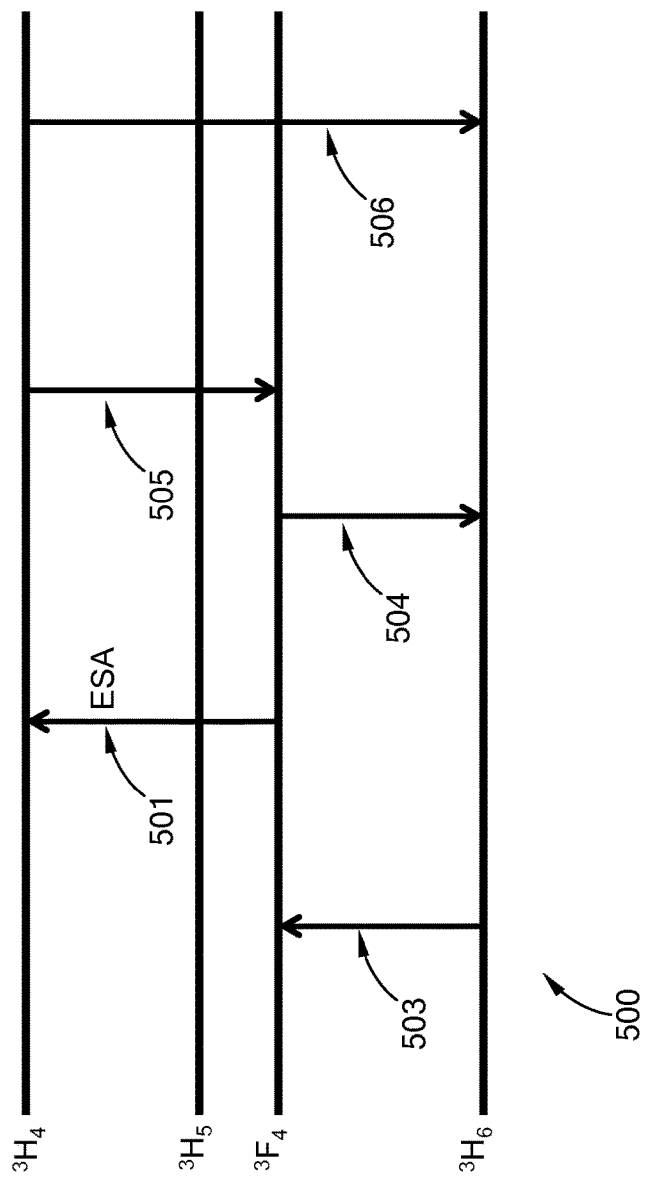
FIG. 8 is a schematic of energy levels and transitions in accordance with the present inventions.

The energy state upconversion process for an embodiment of a Thulium laser is further illustrated in FIG. 8, where energy levels 500 are shown, with a pump wavelength arrow 503 (of 1586 nm), and Excited State Absorption (ESA) wavelength of 1470 nm (arrow 501), and, and emissions arrows 505 (1480 nm), 504 (1800 nm) and 506 (800 nm) are shown.

Figure 9:
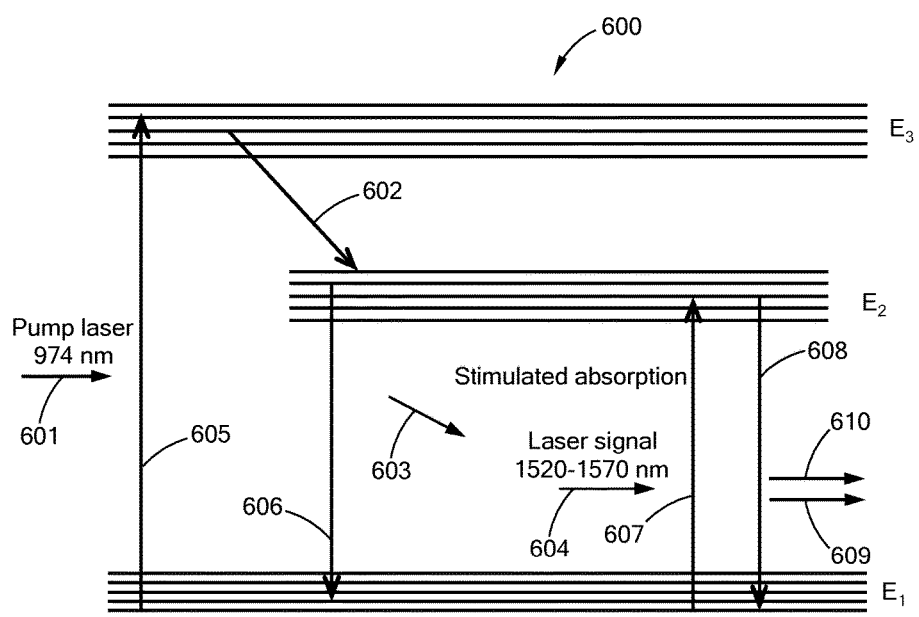
FIG. 9 is a schematic of energy levels and transitions in accordance with the present inventions.

Turning to FIG. 9 there is shown the energy levels 600 for an embodiment of an Erbium laser using a pump laser 601 having a wavelength of 974 nm is provided that when absorbed pumps 605 an electron from the lower E1 state to the high E3 state. The upper laser state E2 can further be resonantly pumped 609 by photons absorbed over the band of 1520 nm to 1570 nm (arrow 604) and reemitted at a slightly longer wavelength ranging from 1521 to 1570 nm (arrows 609, 610). The only criteria for resonantly pumping the upper state is that the emission wavelength must be slightly longer than the absorption wavelength. The advantage of resonantly pumping the upper state is the substantial improvement in the quantum defect for this state compared to pumping E3 with a 974 nm laser. This significant reduction of the pump quantum defect has two beneficial effects, a dramatic reduction in the heat generated in the fiber and a substantial improvement in the overall efficiency of the laser. This laser can be pumped at a short wavelength such as 1520 nm (shown by arrow 604) and lase at two or more longer wavelengths, for example, 1550 nm (shown by arrow 609) and 1570 nm (shown by arrow 610). Multiple lines can be made to oscillate, or different wavelength lasers can be combined to produce the desired spectrum to maximize the 810 nm output. There is also an upconversion process in Eribum, where two 974 nm pump photons can be absorbed to produce a 537 nm photon or a 548 nm photon. The resulting green laser light is ideally suited for transmission through water. Further, arrow 602 is relaxation from the higher lying E3 state to the upper laser state E2, this relaxation is typically caused by collisions with other molecules, transferring heat (phonons) into the host matrix such as glass. Arrow 603 is the spontaneous emission spectrum that can occur from E2 when pumped by E3 through the relaxation reaction 602. The spontaneous emission is lost energy because it is radiated in all directions and does not contribute to the laser signal. Arrow 607 is the pumping of an electron from the ground state to the first excited state E2 by the resonant absorption process. Arrow 608 is the stimulated emission causing the electron to drop from the upper laser state to the ground state as the energy is converted into coherent emissions, 609, 610.

Additionally, if greater laser power is required for the intended downhole or remote laser operation to be performed, or more preferably, be performed in an efficient manner, one, two, three or more multi-laser systems of the general type shown in the embodiment of FIG. 4 may be incorporated or associated with a single umbilical and laser tool. Thus, as noted previously, for example, the high power laser may also be located near the laser tool A 1 kW 808 nm diode laser with a 400 µm output can be used for laser operations. The diode laser is water cooled. This diode laser, for example, is used to demonstrate a submerged laser cut, with a submerged laser nozzle design that does not require a short optical path length in the nozzle. The diode laser has scalable output power.

The chiller, which is used to cool the laser, in embodiments of the systems may be chosen to have a cooling capacity dependent on the size of the laser, the efficiency of the laser, the operating temperature, and environmental location, and preferably the chiller will be selected to operate over the entirety of these parameters.

The source of fluid may be either a gas, a liquid, a foam, or system having multiple capabilities. The fluid may serve many purposes in the advancement of the borehole. Thus, the fluid is primarily used for the removal of cuttings from the bottom of the borehole, for example as is commonly referred to as drilling fluid or drilling mud, and to keep the area between the end of the laser optics in the bottom hole assembly and the bottom of the borehole sufficiently clear of cuttings so as to not interfere with the path and power of the laser beam. It also may function to cool the laser optics and the bottom hole assembly, as well as, in the case of an incompressible fluid, or a compressible fluid under pressure. The fluid further provides a means to create hydrostatic pressure in the well bore to prevent influx of gases and fluids.

Thus, in selecting the type of fluid, as well as the fluid delivery system, consideration should be given to, among other things, the laser wavelength, the optics assembly, the geological conditions of the borehole, the depth of the borehole, and the rate of cuttings removal that is needed to remove the cuttings created by the laser's advancement of the borehole. It is highly desirable that the rate of removal of cuttings by the fluid not be a limiting factor to the systems rate of advancing a borehole. For example fluids that may be employed with the present invention include conventional drilling muds, water, and fluids that are transmissive to the laser. Preferably these fluids can be employed and preferred and should be delivered at rates from a couple to several hundred CFM at a pressure ranging from atmospheric to several hundred psi. If combinations of these fluids are used flow rates should be employed to balance the objects of maintaining the trasmissiveness of the optical path and removal of debris.

The efficiency of the laser's cutting action can also be determined by monitoring the ratio of emitted light to the reflected light. Materials undergoing melting, spallation, thermal dissociation, or vaporization will reflect and absorb different ratios of light. The ratio of emitted to reflected light may vary by material further allowing analysis of material type by this method. Thus, by monitoring the ratio of emitted to reflected light material type, cutting efficiency, or both may be determined. This monitoring may be performed uphole, downhole, or a combination thereof.

Moreover, for a variety of purposes such as powering downhole monitoring equipment, electrical power generation may take place in the borehole including at or near the bottom of the borehole. This power generation may take place using equipment known to those skilled in the art, including generators driven by drilling muds or other downhole fluids, means to convert optical to electrical power, and means to convert thermal to electrical power.

In some aspects, the material, such as a rock surface may be imaged by a camera downhole. Data received by the camera may be used to remove or displace the rock. Further spectroscopy may be used to determine the rock morphology, which information may be used to determine process parameters for removal of material.

In an embodiment, for example, the bottom hole assembly contains the laser, laser optics, the delivery means for the fluid and other equipment. In general the bottom hole assembly preferably contains the optics for directing the laser beam to the earth or rock to be removed for advancing the borehole, or the other structure intended to be cut.

The present systems and in particular the bottom hole assembly, may include one or more optical manipulators. An optical manipulator may generally control a laser beam, such as by directing or positioning the laser beam to spall material, such as rock. In some configurations, an optical manipulator may strategically guide a laser beam to spall material, such as rock. For example, spatial distance from a borehole wall or rock may be controlled, as well as the impact angle. In some configurations, one or more steerable optical manipulators may control the direction and spatial width of the one or more laser beams by one or more reflective mirrors or crystal reflectors. In other configurations, the optical manipulator can be steered by an electro-optic switch, electroactive polymers, galvonometers, piezo-electrics, and/or rotary/linear motors. In at least one configuration, an infrared diode laser or fiber laser optical head may generally rotate about a vertical axis to increase aperture contact length. Various programmable values such as specific energy, specific power, pulse rate, duration and the like maybe implemented as a function of time. Thus, where to apply energy may be strategically determined, programmed and executed so as to enhance a rate of penetration and/or laser/rock interaction, to enhance the overall efficiency of borehole advancement, and to enhance the overall efficiency of borehole completion, including reducing the number of steps on the critical path for borehole completion. One or more algorithms may be used to control the optical manipulator.

In general, embodiments of the laser bottom hole assembly (LBHA) or bottom hole assembly (BHA) which terms are to be used interchangeable, unless specifically provided otherwise, may contain an outer housing that is capable of withstanding the conditions of a downhole environment, a source of a high power laser beam, and optics for the shaping and directing a laser beam on the desired surfaces of the borehole, casing, or formation. The high power laser beam may be greater than about 1 kW, from about 2 kW to about 20 kW, greater than about 5 kW, from about 5 kW to about 10 kW, at least about 10 kW, preferably at least about 15 kW, and more preferably at least about 20 kW. The assembly may further contain or be associated with a system for delivering and directing fluid to the desired location in the borehole, a system for reducing or controlling or managing debris in the laser beam path to the material surface, a means to control or manage the temperature of the optics, a means to control or manage the pressure surrounding the optics, and other components of the assembly, and monitoring and measuring equipment and apparatus, as well as, other types of downhole equipment that are used in conventional mechanical drilling operations. Further, the BHA may incorporate a means to enable the optics to shape and propagate the beam which for example would include a means to control the index of refraction of the environment through which the laser is propagating. Thus, as used herein the terms control and manage are understood to be used in their broadest sense and would include active and passive measures as well as design choices and materials choices.

The LBHA and optics, in at least one aspect, can provide that a beam spot pattern and continuous beam shape may be formed by a refractive, reflective, diffractive or transmissive grating optical element. refractive, reflective, diffractive or transmissive grating optical elements may be made, but are not limited to being made, of fused silica, quartz, ZnSe, Si, GaAs, polished metal, sapphire, and/or diamond. These may be, but are not limited to being, optically coated with the said materials to reduce or enhance the reflectivity.

In accordance with one or more aspects, one or more fiber optic distal fiber ends may be arranged in a pattern. The multiplexed beam shape may comprise a cross, an x shape, a viewfinder, a rectangle, a hexagon, lines in an array, or a related shape where lines, squares, and cylinders are connected or spaced at different distances.

In accordance with one or more aspects, one or more refractive lenses, diffractive elements, transmissive gratings, and/or reflective lenses may be added to focus, scan, and/or change the beam spot pattern from the beam spots emitting from the fiber optics that are positioned in a pattern. One or more refractive lenses, diffractive elements, transmissive gratings, and/or reflective lenses may be added to focus, scan, and/or change the one or more continuous beam shapes from the light emitted from the beam shaping optics. A collimator may be positioned after the beam spot shaper lens in the transversing optical path plane. The collimator may be an aspheric lens, spherical lens system composed of a convex lens, thick convex lens, negative meniscus, and bi-convex lens, gradient refractive lens with an aspheric profile and achromatic doublets. The collimator may be made of the said materials, fused silica, ZnSe, SF glass, or a related material. The collimator may be coated to reduce or enhance reflectivity or transmission. Said optical elements may be cooled by a purging liquid or gas.

In some aspects, the one or more fiber optics with one or more said optical elements and beam spot lens shaper lenses may be steered in the z-direction to keep the focal path constant and rotated by a stepper motor, servo motors, piezoelectric motors, liquid or gas actuator motor, and electro-optics switches. The z-axis may be controlled by the drill string or mechanical standoff. The steering may be mounted to one or more stepper rails, gantry's, gimbals, hydraulic line, elevators, pistons, springs. The one or more fiber optics with one or more fiber optics with one or more said beam spot shaping lens and one or more collimator's may be rotated by a stepper motor, servo motors, piezoelectric motors, liquid or gas actuator motor, and electro-optic switch. The steering may be mounted to one or more stepper rails, gantry's, gimbals, hydraulic line, elevators, pistons, springs.

In some aspects, the fiber optics and said one or more optical elements lenses and beam shaping optics may be encased in a protective optical head made of, for example, the materials steel, chrome-moly steel, steel cladded with hard-face materials such as an alloy of chromium-nickel-cobalt, titanium, tungsten carbide, diamond, sapphire, or other suitable materials known to those in the art which may have a transmissive window cut out to emit the light through the optical head.

In accordance with one or more aspects, a laser source may be coupled to a plurality of optical fiber bundles with the distal end of the fiber arranged to combine fibers together to form bundle pairs, such that the power density through one fiber bundle pair is within the removal zone, e.g., spallation or vaporization zone, and one or more beam spots illuminate the material, such as rock with the bundle pairs arranged in a pattern to remove or displace the rock formation.

In accordance with one or more aspects, the pattern of the bundle pairs may be spaced in such a way that the light from the fiber bundle pairs emerge in one or more beam spot patterns that comprise the geometry of a rectangular grid, a circle, a hexagon, a cross, a star, a bowtie, a triangle, multiple lines in an array, multiple lines spaced a distance apart non-linearly, an ellipse, two or more lines at an angle, or a related shape. The pattern of the bundle pairs may be spaced in such a way that the light from the fiber bundles emerge as one or more continuous beam shapes that comprise above geometries. A collimator may be positioned at a said distance in the same plane below the distal end of the fiber bundle pairs. One or more beam shaping optics may be positioned at a distance in the same plane below the distal end of the fiber bundle pairs. An optical element such as a non-axis-symmetric lens may be positioned at a said distance in the same plane below the distal end of the fiber bundle pairs. Said optical elements may be positioned at an angle to the rock formation and rotated on an axis.

In accordance with one or more aspects, the distal fiber end made up of fiber bundle pairs may be steered in the X,Y,Z, planes and rotationally using a stepper motor, servo motors, piezoelectric motors, liquid or gas actuator motor. The distal fiber end may be made up of fiber bundle pairs being steered with a collimator or other optical element, which could be an objective, such as a non-axis-symmetric optical element. The steering may be mounted to one or more mechanical, hydraulic, or electro-mechanical element to move the optical element. The distal end of fiber bundle pairs, and optics may be protected as described above. The optical fibers may be single-mode and/or multimode. The optical fiber bundles may be composed of single-mode and/or multimode fibers.

It is readily understood in the art that the terms lens and optic(al) elements, as used herein is used in its broadest terms and thus may also refer to any optical elements with power, such as reflective, transmissive or refractive elements, In some aspects, the optical fibers may be entirely constructed of glass, hollow core photonic crystals, and/or solid core photonic crystals. The optical fibers may be jacketed with materials such as, polyimide, acrylate, carbon polyamide, or carbon/dual acrylate. Light may be sourced from a diode laser, disk laser, chemical laser, fiber laser, or fiber optic source is focused by one or more positive refractive lenses.

In at least one aspect, the positive refractive lens types may include, a non-axis-symmetric optic such as a plano-convex lens, a biconvex lens, a positive meniscus lens, or a gradient refractive index lens with a plano-convex gradient profile, a biconvex gradient profile, or positive meniscus gradient profile to focus one or more beams spots to the rock formation. A positive refractive lens may be comprised of the materials, fused silica, sapphire, ZnSe, or diamond. Said refractive lens optical elements can be steered in the light propagating plane to increase/decrease the focal length. The light output from the fiber optic source may originate from a plurality of one or more optical fiber bundle pairs forming a beam shape or beam spot pattern and propagating the light to the one or more positive refractive lenses.

In some aspects, the refractive positive lens may be a microlens. The microlens can be steered in the light propagating plane to increase/decrease the focal length as well as perpendicular to the light propagating plane to translate the beam. The microlens may receive incident light to focus to multiple foci from one or more optical fibers, optical fiber bundle pairs, fiber lasers, diode lasers; and receive and send light from one or more collimators, positive refractive lenses, negative refractive lenses, one or more mirrors, diffractive and reflective optical beam expanders, and prisms.

In some aspects, a diffractive optical element beam splitter could be used in conjunction with a refractive lens. The diffractive optical element beam splitter may form double beam spots or a pattern of beam spots comprising the shapes and patterns set forth above.

In at least one aspect, the positive refractive lens may focus the multiple beam spots to multiple foci. To remove or displace the rock formation.

In accordance with one or more aspects, a collimator lens may be positioned in the same plane and in front of a refractive or reflective diffraction beam splitter to form a beam spot pattern or beam shape; where a beam expander feeds the light into the collimator. The optical elements may be positioned in the X,Y,Z plane and rotated mechanically.

In accordance with one or more aspects, the laser beam spot to the transversing mirror may be controlled by a beam expander. The beam expander may expand the size of the beam and send the beam to a collimator and then to a scanner of two mirrors positioning the laser beam in the XY, YZ, or XZ axis. A beam expander may expand the size of the beam and sends the beam to a collimator, then to a diffractive or reflective optical element, and then to a scanner of two mirrors positioning the laser beam in the XY, YZ, or XZ axis. A beam expander may expand the size of the beam and send the beam to a beam splitter attached behind a positive refractive lens, that splits the beam and focuses is, to a scanner of two mirrors positioning the laser beam in the XY, YZ, or XZ axis.

In at least one aspect, a gas or liquid purge is employed. The purge gas or liquid may remove or displace the cuttings, rock, or other debris from the borehole. The fluid temperature may be varied to enhance rock removal, and provide cooling.

One or more lasers may be positioned downhole, i.e., down the borehole. They may be positioned deep within the borehole. Thus, the high power lasers may be located near the laser tool. Thus, by way of example, as illustrated in FIG. 1 the bottom hole assembly comprises an upper part 9000 and a lower part 9001. The upper part 9000 may be connected to the lower end of the coiled tubing, drill pipe, or other means to lower and retrieve the bottom hole assembly from the borehole. Further, it may be connected to stabilizers, drill collars, or other types of downhole assemblies (not shown in the figure), which in turn are connected to the lower end of the coiled tubing, drill pipe, or other means to lower and retrieve the bottom hole assembly from the borehole. The upper part 9000 further contains the means 9002 that transmitted the high power energy down the borehole and the lower end 9003 of that means. In FIG. 1 the lower end of that means is shown as a bundle of four optical cables. The upper part 9000 may also have air amplification nozzles 9005 that discharge a portion up to 100% of the fluid, for example $N_2$. The upper part 9000 is joined to the lower part 9001 with a sealed chamber 9004 that is transparent to the laser beam and forms a pupil plane for the beam shaping optics 9006 in the lower part 9001. The lower part 9001 may be designed to rotate and in this way for example an elliptical shaped laser beam spot can be rotated around the bottom of the borehole. The lower part 9001 has a laminar flow outlet 9007 for the fluid and two hardened rollers 9008, 9009 at its lower end, although non-laminar flows and turbulent flows may be employed.

In use, the high energy laser beam, for example greater than 10 kW, would travel from the down hole lasers located near the bottom hole assembly through the means 9002, exit the ends of the fibers 9003 and travel through the sealed chamber and pupil plane 9004 into the optics 9006, where it would be shaped and focused into an elliptical spot. The laser beam would then strike the bottom of the borehole spalling, melting, thermally dissociating, and/or vaporizing the rock and earth struck and thus advance the borehole. The lower part 9001 would be rotating and this rotation would cause the elliptical laser spot to rotate around the bottom of the borehole. This rotation would also cause the rollers 9008, 9009 to physically dislodge any material that was crystallized by the laser or otherwise sufficiently fixed to not be able to be removed by the flow of the fluid alone. The cuttings would be cleared from the laser path by the laminar flow of the fluid, as well as, by the action of the rollers 9008, 9009 and the cuttings would then be carried up the borehole by the action of the fluid from the air amplifier 9005, as well as, the laminar flow opening 9007.

Figure 3:
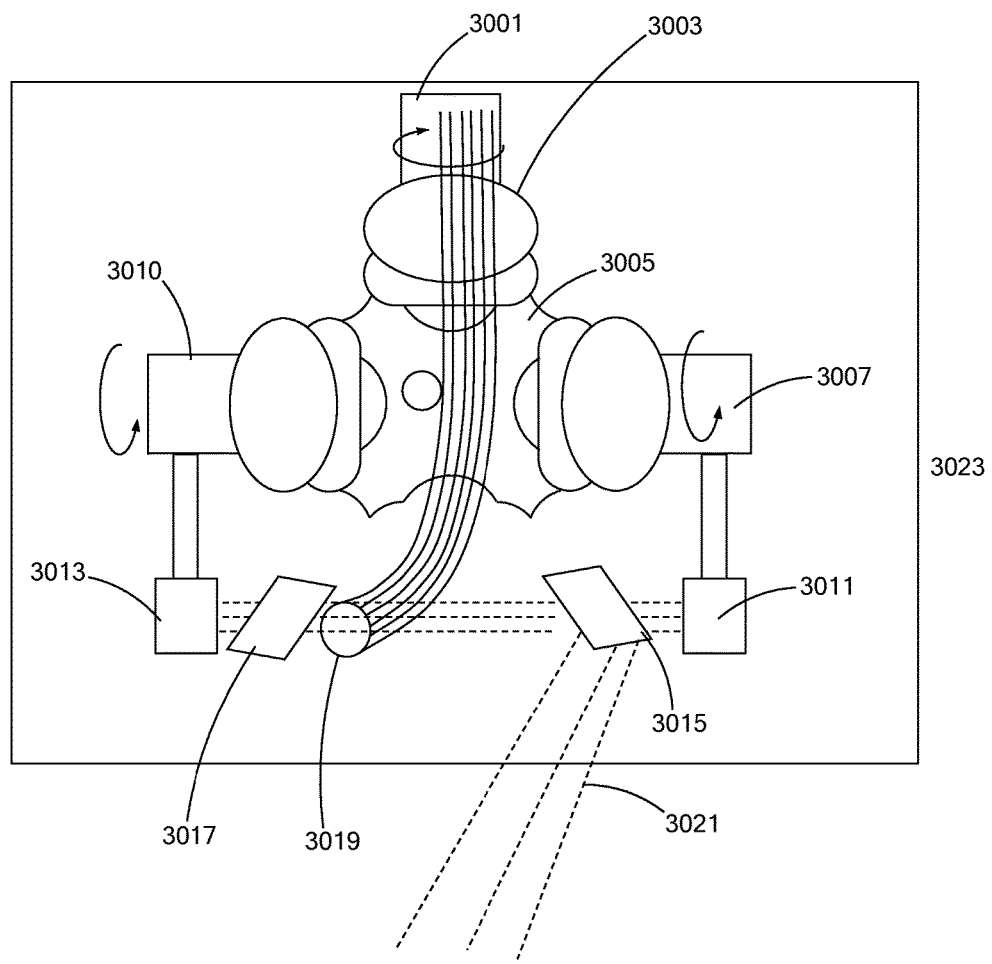
FIG. 3 illustrates a Laser Bottom Hole Assembly

By way of example and to further demonstrate the present teachings, FIG. 3 illustrates optical mirrors scanning a lasing beam spot or shape to chip a rock formation in the XY-plane. Thus, there is shown, with respect to a casing 3023 in a borehole, a first motor of rotating 3001, a plurality of fiber optics in a pattern 3003, a gimbal 3005, a second rotational motor 3007 and a third rotational motor 3010. The second rotational motor 3007 having a stepper motor 3011 and a mirror 3015 associated therewith. The third rotational motor 3010 having a stepper motor 3013 and a mirror 3017 associated therewith. The optical elements 3019 optically associated with optical fibers 3003 and capable of providing laser beam along optical path 3021. As the gimbal rotates around the z-axis and repositions the mirrors in the XY-plane. The mirrors are attached to a stepper motor to rotate stepper motors and mirrors in the XY-plane. In this embodiment, fiber optics are spaced in a pattern forming three beam spots manipulated by optical elements that scan the rock formation a distance apart and non-overlapping to cause rock chipping. Other fiber optic patterns, shapes, or a diode laser can be used.

Generally, and by way of example, an embodiment of the present inventions relate to high power lasers, high power laser wavelength converters, systems and methods; and include selecting and providing high power laser energy having predetermined wavelengths to enhance, and preferably maximize, the efficiency of the laser beam transmission and delivery to perform a laser operation at a remote location. Thus, and in general, the present inventions relate to, among other things, a laser, a downhole laser, and a system utilizing two or more laser beam wavelengths. In this system the first wavelength is selected for high power transmission efficiency over long distances and a second wavelength is selected for high power propagation efficiency through free space environments. This system further, and preferably, converts by way of a novel remote, e.g., down hole laser, the laser energy of the first wavelength to laser energy of the second wavelength after all, or substantially all of the transmission distance has been covered, e.g., at or near the general area of the intended laser operation, or at or near the distal end of the transmission fiber.

Thus, in general cutting removal system may be typical of that used in an oil drilling system. These would include by way of example a shale shaker. Further, desanders and desilters and then centrifuges may be employed. The purpose of this equipment is to remove the cuttings so that the fluid can be recirculated and reused. If the fluid, i.e., circulating medium is gas, than a water misting systems may also be employed.

There is provided by way of examples illustrative and simplified plans of potential drilling scenarios using the laser drilling systems and apparatus of the present invention.

Drilling Plan Embodiment 1

| | Depth | Rock type | Drilling type/Laser power down hole |
|---|---|---|---|
| Drill 17½ inch hole | Surface-3000 ft | Sand and shale | Conventional mechanical drilling |
| Run 13⅜ inch casing | Length 3000 ft | | |
| Drill 12¼ inch hole | 3000 ft-8,000 ft | basalt | 40 kW (minimum) |
| Run 9⅝ inch casing | Length 8,000 ft | | |
| Drill 8½ inch hole | 8,000 ft-11,000 ft | limestone | Conventional mechanical drilling |
| Run 7 inch casing | Length 11,000 ft | | |
| Drill 6¼ inch hole | 11,000-14,000 ft | Sand stone | Conventional mechanical drilling |
| Run 5 inch liner | Length 3000 ft | | |

Drilling Plan Embodiment 2

| | Depth | Rock type | Drilling type/Laser power down hole |
|---|---|---|---|
| Drill 17½ inch hole | Surface-500 ft | Sand and shale | Conventional mechanical drilling |
| Run 13⅜ casing | Length 500 ft | | |
| Drill 12¼ inch hole | 500 ft-4,000 ft | granite | 40 kW (minimum) |
| Run 9⅝ inch casing | Length 4,000 ft | | |
| Drill 8½ inch hole | 4,000 ft-11,000 ft | basalt | 20 kW (minimum) |
| Run 7 inch casing | Length 11,000 ft | | |
| Drill 6¼ inch hole | 11,000 ft-14,000 ft | Sand stone | Conventional mechanical drilling |
| Run 5 inch liner | Length 3000 ft | | |

Moreover, one or more laser beams may form a ledge out of material, such as rock by spalling the rock in a pattern. One or more laser beams may spall rock at an angle to the ledge forming rock fractures surrounding the ledge to chip the piece of rock surrounding the ledge. Two or more beams may chip the rock to create a ledge. The laser beams can spall the rock at an angle to the ledge forming rock fractures surrounding the ledge to further chip the rock. Multiple rocks can be chipped simultaneously by more than one laser beams after one or more rock ledges are created to chip the piece of rock around the ledge or without a ledge by converging two beams near a point by spalling; further a technique known as kerfing may be employed.

A laser may be conveyed into the wellbore by a conduit made of coiled tubing or rigid drill-string. A power cable may be provided. A circulation system may also be provided. The circulation system may have a rigid or flexible tubing to send a liquid or gas downhole. A second tube may be used to raise the rock cuttings up to the surface. A pipe may send or convey gas or liquid in the conduit to another pipe, tube or conduit. The gas or liquid may create an air knife by removing material, such as rock debris from the laser head. A nozzle, such as a Laval nozzle may be included. For example, a Laval-type nozzle may be attached to the optical head to provide pressurized gas or liquid. The pressurized gas or liquid may be transmissive to the working wavelength of the infrared diode laser or fiber laser light to force drilling muds away from the laser path. Additional tubing in the conduit may send a lower temperature liquid downhole than ambient temperature at a depth to cool the laser in the conduit. One or more liquid pumps may be used to return cuttings and debris to the surface by applying pressure uphole drawing incompressible fluid to the surface.

The drilling mud in the well may be transmissive to visible, near-IR range, and mid-IR wavelengths so that the laser beam has a clear optical path to the rock without being absorbed by the drilling mud.

Further, spectroscopic sample data may be detected and analyzed. Analysis may be conducted simultaneously while drilling from the heat of the rock being emitted. Spectroscopic samples may be collected by laser-induced breakdown derivative spectroscopy. Pulsed power may be supplied to the laser-rock impingement point by the infrared diode laser. The light may be analyzed by a single wavelength detector attached to the infrared diode laser. For example, Raman-shifted light may be measured by a Raman spectrometer. Further, for example, a tunable diode laser using a few-mode fiber Bragg grating may be implemented to analyze the band of frequencies of the fluid sample by using ytterbium, thulium, neodymium, dysprosium, praseodymium, or erbium as the active medium. In some embodiments, a chemometric equation, or least mean square fit may be used to analyze the Raman spectra. Temperature, specific heat, and thermal diffusivity may be determined. In at least one embodiment, data may be analyzed by a neural network. The neural network may be updated real-time while drilling. Updating the diode laser power output from the neural network data may optimize drilling performance through rock formation type.

An apparatus to geo-navigate the well for logging may be included or associated with the drilling system. For example, a magnetometer, 3-axis accelerometer, and/or gyroscope may be provided. As discussed with respect to the laser, the geo-navigation device may be encased, such as with steel, titanium, diamond, or tungsten carbide. The geo-navigation device may be encased together with the laser or independently. In some embodiments, data from the geo-navigation device may direct the directional movement of the apparatus downhole from a digital signal processor.

A high power optical fiber bundle may, by way of example, hang from an infrared diode laser or fiber laser downhole. The fiber may generally be coupled with the diode laser to transmit power from the laser to the rock formation. In at least one embodiment, the infrared diode laser may be fiber coupled at a wavelength range between 800 nm to 1000 nm. In some embodiments, the fiber optical head may not be in contact with the borehole. The optical cable may be a hollow core photonic crystal fiber, silica fiber, or plastic optical fibers including PMMA/perfluorinated polymers that are in single or multimode. In some embodiments, the optical fiber may be encased by a coiled or rigid tubing. The optical fiber may be attached to a conduit with a first tube to apply gas or liquid to circulate the cuttings. A second tube may supply gas or liquid to, for example, a Laval nozzle jet to clear debris from the laser head. In some embodiments, the ends of the optical fibers are encased in a head composed of a steerable optical manipulator and mirrors or crystal reflector. The encasing of the head may be composed of sapphire or a related material. An optical manipulator may be provided to rotate the optical fiber head. In some embodiments, the infrared diode laser may be fully encased by steel, titanium, diamond, or tungsten carbide residing above the optical fibers in the borehole. In other embodiments, it may be partially encased.

In accordance with one or more configurations, a fiber laser or infrared diode laser downhole may transmit coherent light down a hollow tube without the light coming in contact with the tube when placed downhole. The hollow tube may be composed of any material. In some configurations, the hollow tube may be composed of steel, titanium or silica. A mirror or reflective crystal may be placed at the end of the hollow tube to direct collimated light to the material, such as a rock surface being drilled. In some embodiments, the optical manipulator can be steered by an electro-optic switch, electroactive polymers, galvonometers, piezoelectrics, or rotary/linear motors. A circulation system may be used to raise cuttings. One or more liquid pumps may be used to return cuttings to the surface by applying pressure uphole, drawing incompressible fluid to the surface. In some configurations, the optical fiber may be attached to a conduit with two tubes, one to apply gas or liquid to circulate the cuttings and one to supply gas or liquid to a Laval nozzle jet to clear debris from the laser head.

The apparatus and methods of the present invention may be used with drilling rigs and equipment such as in exploration and field development activities. Thus, they may be used with, by way of example and without limitation, land based rigs, mobile land based rigs, fixed tower rigs, barge rigs, drill ships, jack-up platforms, and semi-submersible rigs. They may be used in operations for advancing the well bore, finishing the well bore and work over activities, including perforating the production casing. They may further be used in window cutting and pipe cutting and in any application where the delivery of the laser beam to a location, apparatus or component that is located deep in the well bore may be beneficial or useful.

What is claimed:

1. A high power laser bottom hole assembly comprising:
   a. a high power laser, the high power laser comprising an array of diodes capable of providing a high power laser beam;
   b. the high power laser beam having at least about 5 kW of power, having a beam parameter of less than 50 mm millrad, and having a wavelength selected from the range of 455 nm to 810 nm;
   c. a cooling system for the high power laser;
   d. a channel for directing a working fluid; and,
   e. laser optics, whereby the high power laser and the laser optics are in optical communication, thereby providing the ability to direct the high power laser beam within the bottom hole assembly, out of the bottom hole assembly and to a down hole target.

2. The assembly of claim 1, wherein the target is selected from the group consisting of a down hole plug, a production casing, a casing, a bore hole sidewall, and a bottom of a borehole.

3. The assembly of claim 1, wherein the beam parameter of less than 15 mm millrad.

4. A method of performing down hole laser operations in a bore hole below the surface of the earth, the method comprising:
   a. lowering an assembly comprising a high power laser below the surface of the earth into a borehole;
   b. providing a source of power to the high power laser;
   c. generating below the surface of the earth in the borehole a high power laser beam having at least 5 kW of power and a wavelength less than 810 nm;
   d. directing the high power laser beam through optics, whereby the laser beam is shape into a predetermined pattern; and,
   e. directing the laser beam to a target in the borehole to perform a laser operation.

5. The method of claim 4, wherein the target is selected from the group consisting of a down hole plug, a production casing, a casing, a bore hole sidewall, and a bottom of a borehole.

6. The method of claim 4, wherein the laser operation is selected from the group consisting of advancing the well bore, finishing the well bore, and work over activities.

7. The method of claim 4, wherein the laser operation is selected from the group consisting of drilling, perforating, window cutting, pipe cutting, and plug removal.

8. The method of claim 4, wherein generating below the surface of the earth in the borehole a high power laser beam comprising combining laser beams from a plurality of laser sources.

9. The method of claim 4, wherein the high power laser comprises a diode laser.

10. The method of claim 9, wherein the target is selected from the group consisting of the bottom of a borehole, the side wall of a borehole, a casing, a tubular, an interior surface of a tubular, an exterior surface of a tubular, and a subsea structure.

11. The method of claim 4, wherein the high power laser comprises a plurality of high brightness diode lasers; and wherein the laser beam has an $M^2$ of less than 2.

12. The method of claim 4, wherein the high power laser comprises a plurality phase arrayed diode lasers.

13. The method of claim 4, wherein the high power laser comprises a high brightness diode laser; and wherein the laser beam has a beam parameter of less than 50 mm millrad.

14. The method of claim 4, wherein the high power laser comprises a high brightness diode laser; and wherein the laser beam has a beam parameter of less than 15 mm millrad.

15. The method of claim 4, wherein the high power laser comprises a high brightness diode laser; and wherein the laser beam has a beam parameter of less than 12 mm millrad.

16. The method of claim 15, wherein the target is selected from the group consisting of the bottom of a borehole, the side wall of a borehole, a casing, a tubular, an interior surface of a tubular, an exterior surface of a tubular, and a subsea structure.

17. The method of claim 16, wherein the source of power is electrical, and the electrical optical efficiency of the high power laser is at least 25%.

18. The method of claim 4, wherein the power source is selected from the group consisting of an optical power source, a power cable, and a down hole electrical generator.

19. The method of claim 18, wherein the target is selected from the group consisting of the bottom of a borehole, the side wall of a borehole, a casing, a tubular, an interior surface of a tubular, an exterior surface of a tubular, and a subsea structure.

20. The method of claim 4 comprising sorption cooling of the laser.

21. The method of claim 20, wherein the target is selected from the group consisting of the bottom of a borehole, the side wall of a borehole, a casing, a tubular, an interior surface of a tubular, an exterior surface of a tubular, and a subsea structure.

22. The method of claim 4, comprising delivering a working fluid to the target, wherein the working fluid has been selected to minimize the absorption of the laser beam.

23. The method of claim 22, wherein the absorption of the laser beam by the working fluid is less than 0.001 l/cm.

24. The method of claim 22, wherein the target is selected from the group consisting of the bottom of a borehole, the side wall of a borehole, a casing, a tubular, an interior surface of a tubular, an exterior surface of a tubular, and a subsea structure.

25. The method of claim 22, wherein the absorption of the laser beam by the working fluid is less than 0.1% per inch.

26. The method of claim 22, wherein the absorption of the laser beam by the working fluid is less than 4% per inch.

27. The method of claim 26, wherein the target is selected from the group consisting of the bottom of a borehole, the side wall of a borehole, a casing, a tubular, an interior surface of a tubular, an exterior surface of a tubular, and a subsea structure.

28. The method of claim 4 comprising lowering the assembly from a field unit, the field unit selected from the group consisting of land based rigs, mobile land based rigs, fixed tower rigs, barge rigs, drill ships, jack-up platforms, and semi-submersible rigs.

29. The method of claim 4, wherein the target is selected from the group consisting of the bottom of a borehole, the side wall of a borehole, a casing, a tubular, an interior surface of a tubular, an exterior surface of a tubular, and a subsea structure.

30. The method of claim 29, wherein the source of power is electrical, and the electrical optical efficiency of the high power laser is at least 25%.

31. The method of claim 4, wherein the laser operation is selected from the group consisting of cutting, heat treating, thermal processing, annealing, advancing a borehole, workover and completion, removing material, cleaning, milling, flow assurance, decommissioning, plugging, abandonment and perforating.

32. The method of claim 4, wherein the source of power is electrical, and the electrical optical efficiency of the high power laser is at least 10%.

33. The method of claim 4, wherein the source of power is electrical, and the electrical optical efficiency of the high power laser is at least 25%.

34. A method of performing laser operations below the surface of the earth, the method comprising:
a. lowering an assembly comprising a high power laser beam source below the surface of the earth to a depth within a borehole, the high power laser beam source comprising a plurality of lasers, wherein the lasers are capable of generating laser beams having waive lengths of 810 nm or less;
b. providing a source of power to the high power laser source;
c. generating below the surface of the earth in the borehole a plurality of laser beam having wavelengths of 810 nm or less; combining a plurality of the laser beams to form a single high power laser beam having at least 10 kW of power and a wavelength 810 nm or less;
d. cooling the high power laser source to a temperature at or below 100° C.; and,
e. directing the single high power laser beam to a target in the borehole to perform a laser operation.

35. The method of claim 34, wherein the target is selected from the group consisting of the bottom of a borehole, the side wall of a borehole, a casing, a tubular, an interior surface of a tubular, an exterior surface of a tubular, and a subsea structure.

36. The method of claim 35, wherein the single high power laser beam has a power of at least 10 kW.

37. The method of claim 35, wherein the single high power laser beam has a power of at least 20 kW.

38. The method of claim 34, wherein the laser operation is selected from the group consisting of cutting, heat treating, thermal processing, annealing, advancing a borehole, workover and completion, removing material, cleaning, milling, flow assurance, decommissioning, plugging, abandonment and perforating.

39. The method of claim 38, wherein the source of power is electrical, and the electrical optical efficiency of the high power laser source is at least 25%.

40. The method of claim 34, wherein the cooling comprises sending a liquid downhole, the liquid having a temperature lower than an ambient temperature in the borehole at the depth of the high power laser source.

41. The method of claim 34, wherein the source of power is electrical, and the electrical optical efficiency of the high power laser source is at least 25%.

42. A method of performing down hole laser operations in a bore hole, the method comprising:
a. providing a source of power to a high power laser beam source located at a depth within a borehole, the high power laser beam source comprising a laser; thereby generating a laser beam having a wavelength of less than 900 nm;
b. cooling the laser, wherein the cooling comprises sending a fluid into the borehole, the fluid having a temperature lower than an ambient temperature within the borehole at the depth of the high power laser source;
c. providing within the borehole at the depth of the high power laser source a high power laser beam having at least 5 kW of power and a wavelength less than 900 nm;
d. shaping the high power laser beam into a predetermined shape; and,
e. directing the high power laser beam to a target within the borehole to perform a laser operation at the depth within the borehole.

43. The method of claim 42, wherein the source of power is electrical, and the electrical optical efficiency of the lasers are at least 10%.

44. The method of claim 42, wherein the source of power is electrical, and the electrical optical efficiency of the lasers are at least 25%.

45. The method of claim 42, wherein the laser operation is selected from the group consisting of cutting, heat treating, thermal processing, annealing, advancing a borehole, workover and completion, removing material, cleaning, milling, flow assurance, decommissioning, plugging, abandonment and perforating.

46. A method of performing a laser operation on a target below the surface of the earth, the method comprising:
  a. generating a first laser beam from a first laser; generating a second laser beam from a second laser positioned in a borehole below the surface of the earth;
  b. the second laser beam having an $M^2$ of 2 or less, and a wavelength of 810 nm or less;
  c. combining the first and second laser beams to form an operational laser beam, wherein the operational laser beam has a power of at least about 5 kW;
  d. directing the operational laser beam to a target in the borehole; thereby performing a laser operation on the target; and,
  e. cooling the first and second lasers.

47. The method of claim 46, comprising an electrical power source for the first laser, wherein the electrical optical efficiency of the first laser is at least 25%.

48. The method of claim 46, wherein the laser operation is selected from the group consisting of cutting, heat treating, thermal processing, annealing, advancing a borehole, workover and completion, removing material, cleaning, milling, flow assurance, decommissioning, plugging, abandonment and perforating.

* * * * *